United States Patent
Nakatani et al.

(10) Patent No.: US 12,331,393 B2
(45) Date of Patent: Jun. 17, 2025

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Kimihiko Nakatani, Toyama (JP); Ryuji Yamamoto, Tokyo (JP)

(73) Assignee: Kokusai Electric Corporation, Tokyo (JP)

( * ) Notice: Subject to any disclaimer, the term of this patent is extended or adjusted under 35 U.S.C. 154(b) by 90 days.

(21) Appl. No.: 18/076,091

(22) Filed: Dec. 6, 2022

(65) Prior Publication Data

US 2023/0175116 A1  Jun. 8, 2023

(30) Foreign Application Priority Data

Dec. 8, 2021 (JP) .................................. 2021-199570

(51) Int. Cl.
  *C23C 16/04* (2006.01)
  *C23C 16/455* (2006.01)
  (Continued)

(52) U.S. Cl.
  CPC ...... *C23C 16/042* (2013.01); *C23C 16/45523* (2013.01); *C23C 16/52* (2013.01); *C23C 16/56* (2013.01); *H01L 21/02205* (2013.01)

(58) Field of Classification Search
  CPC ..................................................... C23C 16/52
  See application file for complete search history.

(56) References Cited

U.S. PATENT DOCUMENTS

2014/0017403 A1\* 1/2014 Chu ....................... C23C 28/42
  427/250
2014/0287596 A1  9/2014 Hirose et al.
  (Continued)

FOREIGN PATENT DOCUMENTS

JP  2014-183218 A  9/2014
JP  2017-222928 A  12/2017
  (Continued)

OTHER PUBLICATIONS

Japanese Office Action issued on Oct. 10, 2023 for Japanese Patent Application No. 2021-199570.
  (Continued)

*Primary Examiner* — Austin Murata
(74) *Attorney, Agent, or Firm* — Volpe Koenig

(57) ABSTRACT

There is provided a technique that includes: (A) supplying a modifying agent to a substrate including a first surface and a second surface to form an inhibitor layer on the first surface; and (B) supplying a film-forming agent to the substrate after forming the inhibitor layer on the first surface to form a film on the second surface, wherein a width of an inhibitor molecule constituting the inhibitor layer is defined as WI, a spacing of adsorption sites on the first surface is defined as DA, a width of a molecule X constituting a predetermined substance contained in the film-forming agent is defined as WP, wherein WP>DA−WI is satisfied when WI is smaller than DA, and wherein WP>DAx−WI is satisfied when WI is larger than DA, where x is a smallest integer that satisfies WI<DAx.

23 Claims, 9 Drawing Sheets

(51) Int. Cl.
  *C23C 16/52*   (2006.01)
  *C23C 16/56*   (2006.01)
  *H01L 21/02*   (2006.01)

(56)          References Cited

U.S. PATENT DOCUMENTS

2017/0342553 A1    11/2017   Yu et al.
2019/0017170 A1*   1/2019    Sharma ............. H01L 21/02181
2020/0303185 A1    9/2020    Nakagawa et al.
2020/0303186 A1    9/2020    Nakatan
2021/0115559 A1    4/2021    Sharma et al.
2021/0202245 A1    7/2021    Waseda et al.
2021/0366706 A1    11/2021   Nakatani

FOREIGN PATENT DOCUMENTS

JP       2020-155452 A     9/2020
JP       2020-155607 A     9/2020
JP       2021-106242 A     7/2021
KR    10-2021-0084302 A    7/2021
WO       2023/047918 A1    3/2023

OTHER PUBLICATIONS

European Search Report issued on Apr. 11, 2023 for European Patent Application No. 22211730.1.
Korean Office Action issued on Oct. 15, 2024 for Korean Patent Application No. 10-2022-0167585.
Communication pursuant to Article 94(3) EPC issued on Feb. 20, 2025 for European Patent Application No. 22211730.1.

\* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2021-199570, filed on Dec. 8, 2021, the entire contents of which are incorporated herein by reference.

TECHNICAL FIELD

The present disclosure relates to a method of processing a substrate, a method of manufacturing a semiconductor device, a substrate processing apparatus, and a recording medium.

BACKGROUND

In the related art, as a process of manufacturing a semiconductor device, a process of selectively growing a film on a predetermined surface among a plural types of surfaces exposed on a surface of a substrate and made of different materials (hereinafter, also referred to as selective growth or selective film formation) may be performed.

However, it may be difficult to selectively grow a film on a predetermined surface among a plural types of surfaces, depending on a modifying agent or a film-forming agent used when the selective growth is performed.

SUMMARY

Some embodiments of the present disclosure provide a technique capable of selectively forming a film on a desired surface with high accuracy.

According to embodiments of the present disclosure, there is provided a technique that includes: (A) supplying a modifying agent to a substrate including a first surface and a second surface to form an inhibitor layer on the first surface; and (B) supplying a film-forming agent to the substrate after forming the inhibitor layer on the first surface to form a film on the second surface, wherein a width of an inhibitor molecule constituting the inhibitor layer is defined as WI, a spacing of adsorption sites on the first surface is defined as DA, a width of a molecule X constituting a predetermined substance contained in the film-forming agent is defined as WP, wherein WP>DA−WI is satisfied when WI is smaller than DA, and wherein WP>DAx−WI is satisfied when WI is larger than DA, where x is a smallest integer that satisfies WI<DAx.

BRIEF DESCRIPTION OF DRAWINGS

The accompanying drawings, which are incorporated in and constitute a portion of the specification, illustrate embodiments of the present disclosure.

DETAILED DESCRIPTION

Figure 1:
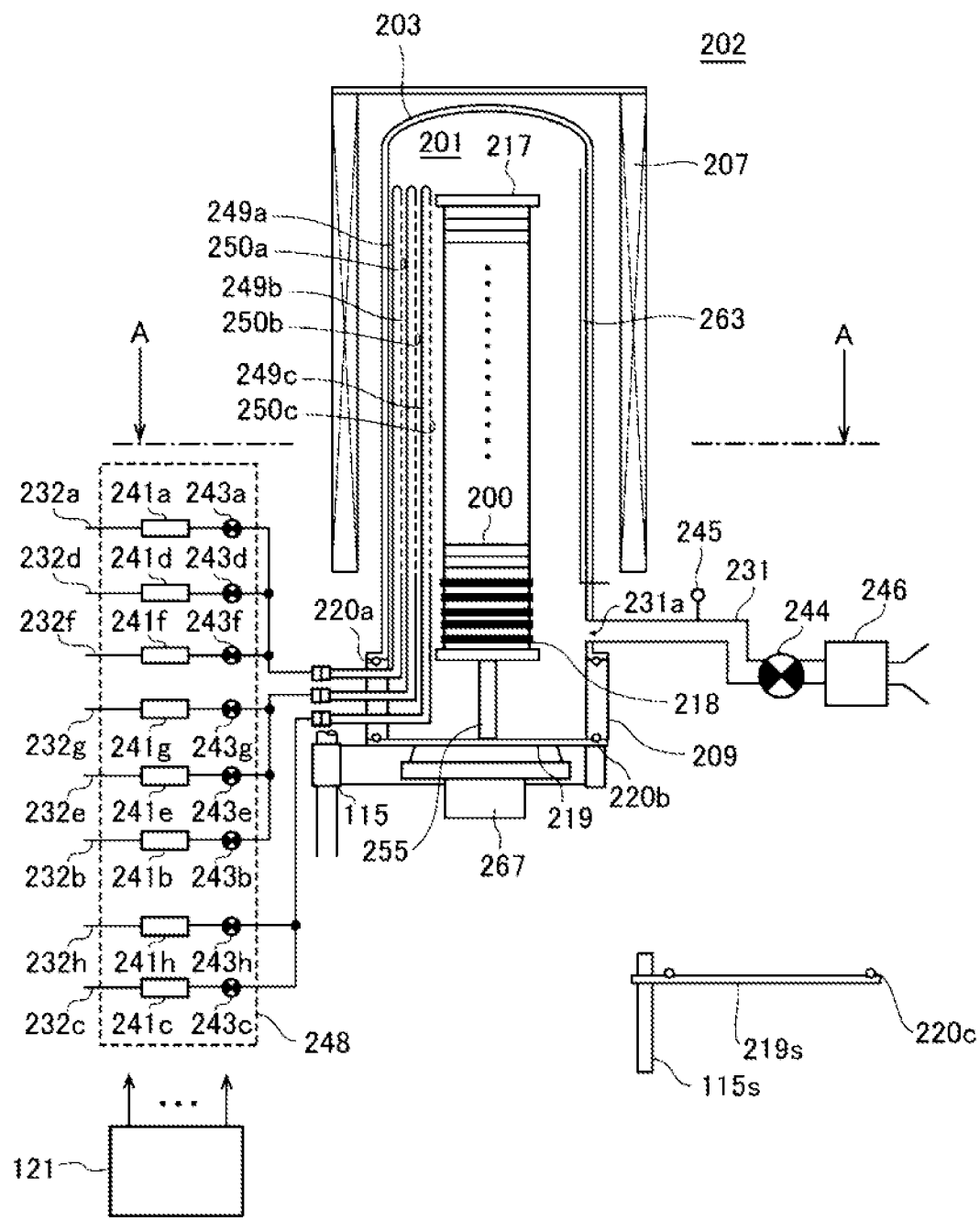
FIG. 1 shows a schematic structure of a vertical process furnace of a substrate processing apparatus suitably used in embodiments of the present disclosure, in which a portion of the process furnace is illustrated in a vertical cross-sectional view.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not been described in detail so as not to obscure aspects of the various embodiments.

EMBODIMENTS OF THE PRESENT DISCLOSURE

Hereinafter, embodiments of the present disclosure will be described mainly with reference to FIGS. 4, 5A to 5E and 6A to 6C. The drawings used in the following description are schematic. Dimensional relationships, ratios, and the like of the respective components illustrated in the drawings may not match actual ones. Further, even among the drawings, dimensional relationships, ratios, and the like of the respective components may not match one another.

(1) Structure of Substrate Processing Apparatus

As shown in FIG. 1, a process furnace 202 includes a heater 207 as a temperature regulator (heating part). The heater 207 is formed in a cylindrical shape and is vertically installed by being supported by a holding plate. The heater 207 also functions as an activator (exciter) that activates (excites) a gas with heat.

Inside the heater 207, a reaction tube 203 is arranged concentrically with the heater 207. The reaction tube 203 is made of, for example, a heat-resistant material such as quartz ($SiO_2$) or silicon carbide (SiC) and is formed in a cylindrical shape with an upper end thereof closed and a lower end thereof opened. Below the reaction tube 203, a manifold 209 is arranged concentrically with the reaction tube 203. The manifold 209 is made of, for example, metallic material such as stainless steel (SUS) or the like and is formed in a cylindrical shape with upper and lower ends thereof opened. The upper end of the manifold 209 is engaged with the lower end of the reaction tube 203 and is configured to support the reaction tube 203. An O-ring 220a as a seal is provided between the manifold 209 and the reaction tube 203. The reaction tube 203 is installed vertically in the same manner as the heater 207. A process container (reaction container) mainly includes the reaction tube 203 and the manifold 209. A process chamber 201 is formed in the hollow portion of the process container. The process chamber 201 is configured to accommodate wafers 200 as substrates. The wafers 200 are processed in the process chamber 201.

Nozzles 249a to 249c as first to third suppliers are installed in the process chamber 201 to penetrate the side wall of the manifold 209. The nozzles 249a to 249c are also referred to as first to third nozzles, respectively. The nozzles 249a to 249c are made of, for example, heat-resistant material such as quartz or SiC. Gas supply pipes 232a to 232c are connected to the nozzles 249a to 249c, respectively. The nozzles 249a to 249c are different nozzles, and the nozzles 249a and 249c are respectively installed adjacent to the nozzle 249b.

At the gas supply pipes 232a to 232c, mass flow controllers (M FCs) 241a to 241c, which are flow rate controllers (flow rate control parts), and valves 243a to 243c, which are on-off valves, are respectively installed sequentially from the upstream side of gas flow. Gas supply pipes 232d and 232f are respectively connected to the gas supply pipe 232a on the downstream side of the valve 243a. Gas supply pipes 232e and 232g are respectively connected to the gas supply pipe 232b on the downstream side of the valve 243b. A gas supply pipe 232h is connected to the gas supply pipe 232c on the downstream side of the valve 243c. At the gas supply pipes 232d to 232h, MFCs 241d to 241h and valves 243d to 243h are respectively installed sequentially from the upstream side of gas flow. The gas supply pipes 232a to 232h are made of, for example, metal material such as stainless steel or the like.

Figure 2:
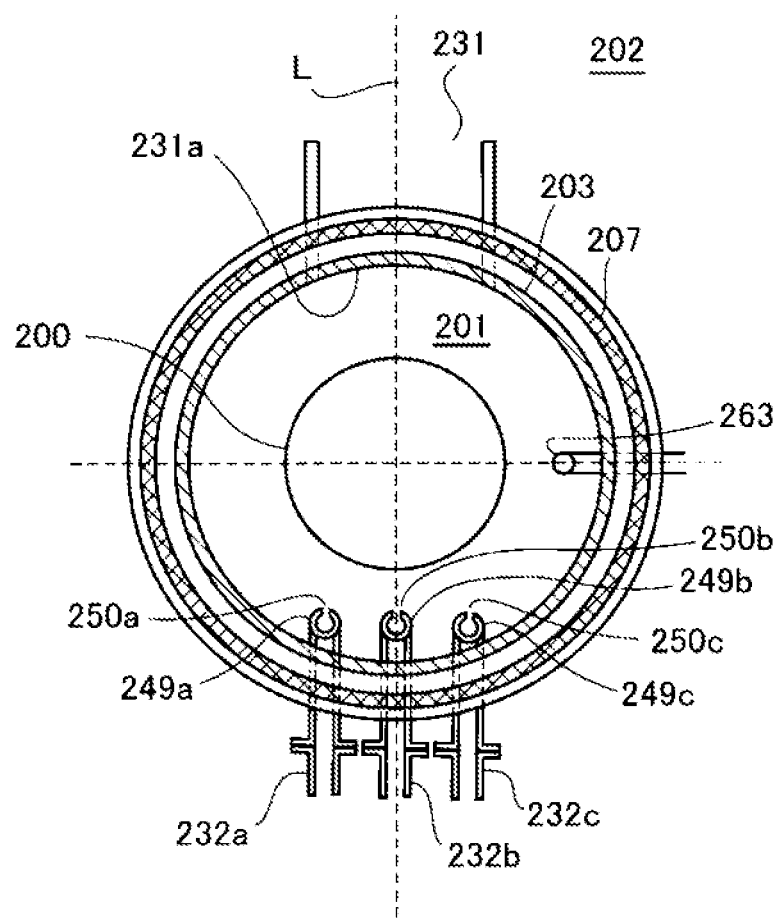
FIG. 2 shows a schematic structure of the vertical process furnace of the substrate processing apparatus suitably used in embodiments of the present disclosure, in which the portion of the process furnace is illustrated in a cross-sectional view taken along line A-A in FIG. 1.

As shown in FIG. 2, the nozzles 249a to 249c are respectively arranged in an annular space in a plane view between the inner wall of the reaction tube 203 and the wafers 200 and are installed to extend upward in the arrangement direction of the wafers 200 from the lower side to the upper side of the inner wall of the reaction tube 203. In other words, the nozzles 249a to 249c are respectively installed in a region horizontally surrounding a wafer arrangement region, in which the wafers 200 are arranged, on the lateral side of the wafer arrangement region so as to extend along the wafer arrangement region. In the plane view, the nozzle 249b is arranged to face an exhaust port 231a, which will be described below, on a straight line across the centers of the wafers 200 loaded into the process chamber 201. The nozzles 249a and 249c are arranged to sandwich a straight line L passing through the nozzle 249b and the center of the exhaust port 231a from both sides along the inner wall of the reaction tube 203 (outer peripheral sides of the wafers 200). The straight line L is also a straight line passing through the nozzle 249a and the center of the wafers 200. That is, the nozzle 249c may be installed on the side opposite to the nozzle 249a with the straight line L interposed therebetween. The nozzles 249a and 249c are arranged line-symmetrically with the straight line L as an axis of symmetry. Gas supply holes 250a to 250c configured to supply gases are formed on the side surfaces of the nozzles 249a to 249c, respectively. The gas supply holes 250a to 250c are respectively opened to face the exhaust port 231a in the plane view and may supply gases toward the wafers 200. The gas supply holes 250a to 250c are formed from the lower side to the upper side of the reaction tube 203.

From the gas supply pipe 232a, a modifying agent is supplied into the process chamber 201 via the MFC 241a, the valve 243a and the nozzle 249a.

From the gas supply pipe 232b, a precursor is supplied into the process chamber 201 via the MFC 241b, the valve 243b, and the nozzle 249b. The precursor is used as a film-forming agent.

From the gas supply pipe 232c, a reactant is supplied into the process chamber 201 via the MFC 241c, the valve 243c, and the nozzle 249c. The reactant is used a film-forming agent.

From the gas supply pipe 232d, a catalyst is supplied into the process chamber 201 via the MFC 241d, the valve 243d, the gas supply pipe 232a, and the nozzle 249a. The catalyst is used as a film-forming agent.

From the gas supply pipe 232e, a cleaning agent or a regulating agent is supplied into the process chamber 201 via the MFC 241e, the valve 243e, the gas supply pipe 232b, and the nozzle 249b.

From the gas supply pipes 232f to 232h, an inert gas is supplied into the process chamber via the MFCs 241f to 241h, the valves 243f to 243h, the gas supply pipes 232a to 232c, and the nozzles 249a to 249c, respectively. The inert gas acts as a purge gas, a carrier gas, a diluting gas, and the like.

A modifying agent supply system mainly includes the gas supply pipe 232a, the MFC 241a, and the valve 243a. A precursor supply system mainly includes the gas supply pipe 232b, the MFC 241b, and the valve 243b. A reactant supply system mainly includes the gas supply pipe 232c, the MFC 241c, and the valve 243c. A catalyst supply system mainly includes the gas supply pipe 232d, the MFC 241d, and the valve 243d. A cleaning agent supply system or a regulating agent supply system mainly includes the gas supply pipe 232e, the MFC 241e, and the valve 243e. An inert gas supply system mainly includes the gas supply pipes 232f to 232h, the MFCs 241f to 241h, and the valves 243f to 243h. Further, the precursor supply system, the reactant supply system, and the catalyst supply system are respectively or entirely referred to as a film-forming agent supply system.

Among the various supply systems described above, any one or the entirety of the supply systems may be constituted as an integrated supply system 248 in which the valves 243a to 243h, the MFCs 241a to 241h and the like are integrated. The integrated supply system 248 is connected to each of the gas supply pipes 232a to 232h, and is configured such that the operation of supplying various substances (various gases) into the gas supply pipes 232a to 232h, i.e., the opening/closing operation of the valves 243a to 243h, the flow rate regulating operation by the MFCs 241a to 241h, and the like are controlled by a controller 121 described below. The integrated supply system 248 is constituted as an integral type or division type integrated unit and may be attached to or detached from the gas supply pipes 232a to 232h on an integrated unit basis. Maintenance, replacement, expansion, and the like of the integrated supply system 248 may be performed on an integrated unit basis.

An exhaust port 231a configured to exhaust the atmosphere in the process chamber 201 is provided at the lower side of the side wall of the reaction tube 203. As shown in FIG. 2, the exhaust port 231a is provided at a position facing the nozzles 249a to 249c (gas supply holes 250a to 250c) with the wafers 200 interposed therebetween in the plane view. The exhaust port 231a may be provided to extend from the lower side to the upper side of the side wall of the reaction tube 203, i.e., along the wafer arrangement region. An exhaust pipe 231 is connected to the exhaust port 231a. A vacuum pump 246 as a vacuum exhauster is connected to the exhaust pipe 231 via a pressure sensor 245 as a pressure detector (pressure detection part) configured to detect the pressure inside the process chamber 201 and an APC (Auto Pressure Controller) valve 244 as a pressure regulator (pressure regulation part). The APC valve 244 is configured to be capable of performing or stopping vacuum evacuation of the interior of the process chamber 201 by being opened or closed while the vacuum pump 246 is operated. Further, the APC valve 244 is configured to be capable of regulating the pressure inside the process chamber 201 by adjusting a valve opening state based on pressure information detected by the pressure sensor 245 while the vacuum pump 246 is operated. An exhaust system mainly includes the exhaust pipe 231, the APC valve 244, and the pressure sensor 245. The vacuum pump 246 may be included in the exhaust system.

A seal cap 219 as a furnace opening lid capable of airtightly closing the lower end opening of the manifold 209 is installed below the manifold 209. The seal cap 219 is made of, for example, metallic material such as stainless steel or the like, and is formed in a disc shape. An O-ring 220b as a seal, which comes into contact with the lower end of the manifold 209, is installed on the upper surface of the seal cap 219. A rotator 267 configured to rotate a boat 217 described below is installed below the seal cap 219. A rotating shaft 255 of the rotator 267 is connected to the boat 217 through the seal cap 219. The rotator 267 is configured to rotate the wafers 200 by rotating the boat 217. The seal cap 219 is configured to be raised or lowered in the vertical direction by a boat elevator 115 as an elevator installed outside the reaction tube 203. The boat elevator 115 is constituted as a transfer apparatus (transfer mechanism) that loads or unloads (transfers) the wafers 200 into or out of the process chamber 201 by raising or lowering the seal cap 219.

Below the manifold 209, a shutter 219s is installed as a furnace opening lid capable of airtightly closing the lower end opening of the manifold 209 while the seal cap 219 is lowered and the boat 217 is unloaded from the process chamber 201. The shutter 219s is made of, for example, metallic material such as stainless steel or the like and is formed in a disk shape. An O-ring 220c as a seal, which comes into contact with the lower end of the manifold 209, is installed on the upper surface of the shutter 219s. The opening/closing operations (the elevating operation, the rotating operation, and the like) of the shutter 219s are controlled by a shutter opening/closing mechanism 115s.

A boat 217 serving as a substrate support is configured to support a plurality of wafers 200, for example, 25 to 200 wafers 200, in such a state that the wafers 200 are arranged in a horizontal posture and in multiple stages along a vertical direction with the centers of the wafers 200 aligned with one another. That is, as the boat 217 is configured to arrange the wafers 200 to be spaced apart from each other. The boat 217 is made of, for example, heat-resistant material such as quartz or SiC. Heat insulating plates 218 made of, for example, heat-resistant material such as quartz or SiC, are supported in multiple stages at the bottom of the boat 217.

A temperature sensor 263 as a temperature detector is installed in the reaction tube 203. By regulating a state of supplying electric power to the heater 207 based on the temperature information detected by the temperature sensor 263, a temperature distribution inside the process chamber 201 becomes a desired temperature distribution. The temperature sensor 263 is installed along the inner wall of the reaction tube 203.

Figure 3:
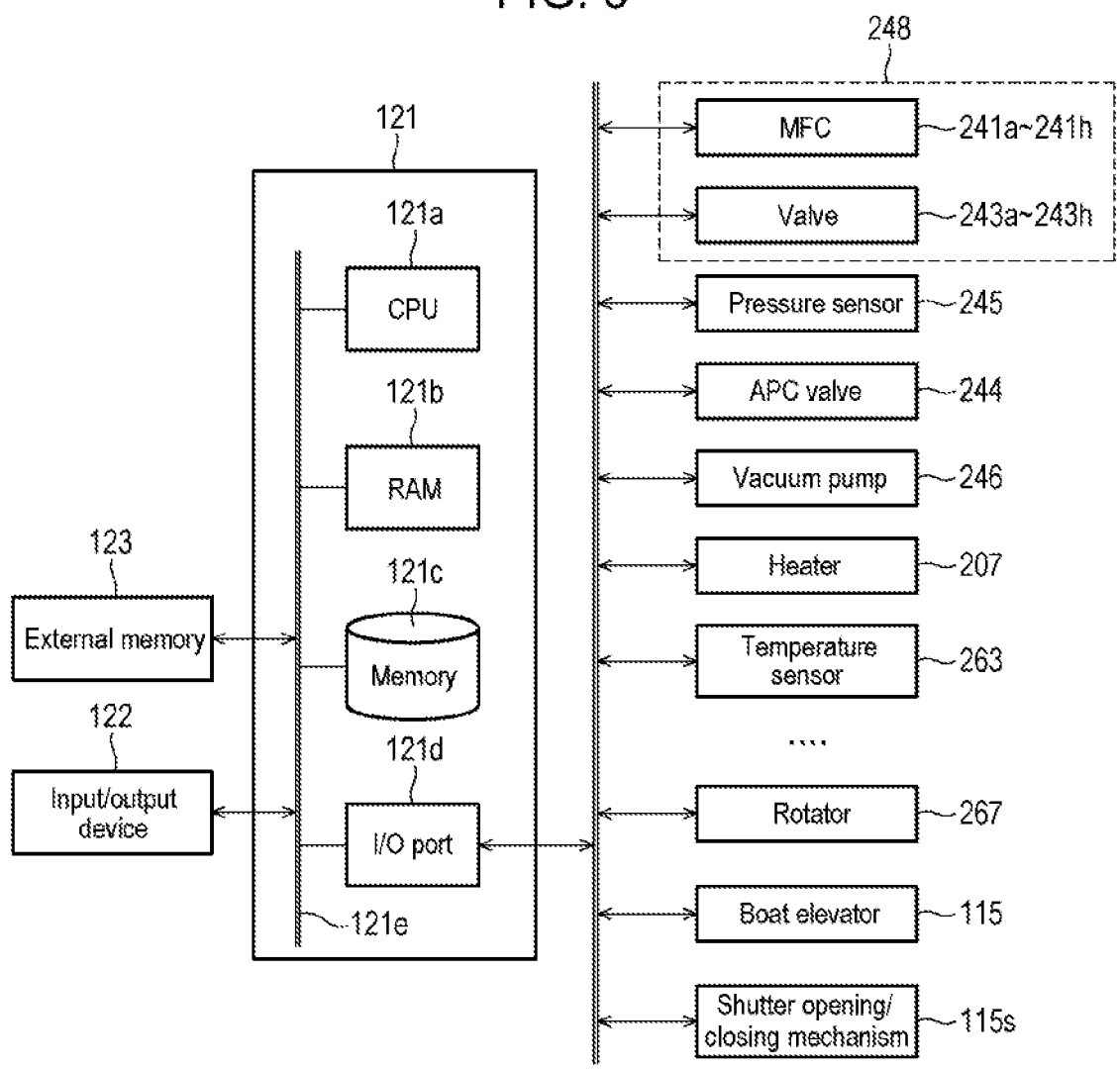
FIG. 3 shows a schematic structure of a controller of a substrate processing apparatus suitably used in embodiments of the present disclosure, in which a control system of the controller is illustrated in a block diagram.

As shown in FIG. 3, the controller 121 as a control part (control means or unit) is constituted as a computer including a CPU (Central Processing Unit) 121a, a RAM (Random Access Memory) 121b, a memory 121c and an I/O port 121d. The RAM 121b, the memory 121c and the I/O port 121d are configured to be capable of exchanging data with the CPU 121a via an internal bus 121e. An input/output apparatus 122 including, for example, a touch panel or the like is connected to the controller 121. In addition, an external memory 123 may be connected to the controller 121.

The memory 121*c* includes, for example, a flash memory, a HDD (Hard Disk Drive), a SSD (Solid State Drive), or the like. A control program that controls the operation of the substrate processing apparatus, a process recipe in which procedures, conditions, and the like of substrate processing described below are written, and the like are readably stored in the memory 121C. The process recipe functions as a program configured to be capable of causing, by the controller 121, the substrate processing apparatus to execute each sequence in the substrate processing described below to obtain a predetermined result. Hereinafter, the process recipe, the control program and the like are collectively and simply referred to as a program. Further, the process recipe is also simply referred to as a recipe. When the term "program" is used herein, it may mean a case of including the recipe, a case of including the control program, or a case of including both the recipe and the control program. The RAM 121*b* is constituted as a memory area (work area) in which programs, data and the like read by the CPU 121*a* are temporarily stored.

The I/O port 121*d* is connected to the MFCs 241*a* to 241*h*, the valves 243*a* to 243*h*, the pressure sensor 245, the APC valve 244, the vacuum pump 246, the temperature sensor 263, the heater 207, the rotator 267, the boat elevator 115, the shutter opening/closing mechanism 115*s*, and the like.

The CPU 121*a* is configured to read and execute the control program from the memory 121*c* and to read the recipe from the memory 121*c* in response to an input of an operation command from the input/output apparatus 122 or the like. The CPU 121*a* is configured to, according to the contents of the recipe thus read, control the flow rate regulation operation of various substances (various gases) by the MFCs 241*a* to 241*h*, the opening/closing operations of the valves 243*a* to 243*h*, the opening/closing operation of the APC valve 244, the pressure regulation operation by the APC valve 244 based on the pressure sensor 245, the start and stop of the vacuum pump 246, the temperature regulation operation of the heater 207 based on the temperature sensor 263, the rotation and the rotation speed adjustment operation of the boat 217 by the rotator 267, the raising or lowering operation of the boat 217 by the boat elevator 115, the opening/closing operation of the shutter 219*s* by the shutter opening/closing mechanism 115*s*, and the like.

The controller 121 may be configured by installing, in the computer, the above-described program stored in an external memory 123. The external memory 123 includes, for example, a magnetic disk such as a HDD, an optical disk such as a CD, a magneto-optical disk such as an MO, a semiconductor memory such as a USB memory or a SSD, and so forth. The memory 121*c* and the external memory 123 are constituted as a computer readable recording medium. Hereinafter, the memory 121*c* and the external memory 123 are collectively and simply referred to as a recording medium. As used herein, the term "recording medium" may include the memory 121*c*, the external memory 123, or both. The program may be supplied to the computer by using a communication means or unit such as the Internet or a dedicated line instead of using the external memory 123.

(2) Substrate Processing Process

As a process of manufacturing a semiconductor device by using the substrate processing apparatus described above, a method of processing a substrate, that is, an example of a processing sequence of selectively forming a film on the second surface of the wafer 200 as a substrate including the first surface and the second surface will be described mainly with reference to FIGS. 4, 5A to 5E and 6A to 6C. In the following description, the operation of each component constituting the substrate processing apparatus is controlled by the controller 121.

The surface of the wafer 200 includes a first base and a second base, a surface of the first base constitutes the first surface, and a surface of the second base constitutes the second surface. In the following, for the sake of convenience, as a typical example, there will be described a case where the first base is a silicon oxide film ($SiO_2$ film, which is also referred to as a SiO film below) as an oxide film (oxygen-containing film), and the second base is a silicon nitride film ($Si_3N_4$ film, which is also referred to as a SiN film below) as anon-oxidized film (oxygen-free film). That is, in the following, there will be described a case where the first surface is constituted by the surface of the SiO film as the first base and the second surface is constituted by the surface of the SiN film as the second base will be described. The first base and the second base are also referred to as a first base film and a second base film, respectively.

A processing sequence according to the embodiments of the present disclosure includes:
- (A) step of supplying a modifying agent to a wafer 200 including a first surface and a second surface to form an inhibitor layer on the first surface (modifying step); and
- (B) step of supplying a film-forming agent to the wafer 200 after forming the inhibitor layer on the first surface to form a film on the second surface (film-forming step),
- wherein a width of an inhibitor molecule constituting the inhibitor layer is defined as WI, a spacing of adsorption sites on the first surface is defined as DA, and a width of a molecule X constituting a predetermined substance (predetermined chemical substance) contained in the film-forming agent is defined as WP,
- wherein WP>DA−WI is satisfied when WI is smaller than DA, and
- wherein WP>DAx−WI is satisfied when WI is larger than DA, where x is the smallest integer that satisfies WI<DAx.

Each step is performed in a non-plasma atmosphere.

In the following example, a case where the film-forming agent includes a precursor, a reactant, and a catalyst will be described. The precursor, the reactant, and the catalyst differ in molecular structure from one another. Further, in the following example, a case where the above-mentioned predetermined substance contained in the film-forming agent is a precursor will be described. That is, a case where the molecule X is a precursor molecule will be described. The predetermined substance contained in the film-forming agent may be a reactant. That is, the molecule X may be a reactant molecule. Further, the predetermined substance contained in the film-forming agent may be a catalyst. That is, the molecule X may be a catalyst molecule. In other words, the predetermined substance contained in the film-forming agent may include at least one selected from the group of a precursor, a reactant, and a catalyst.

Figure 4:
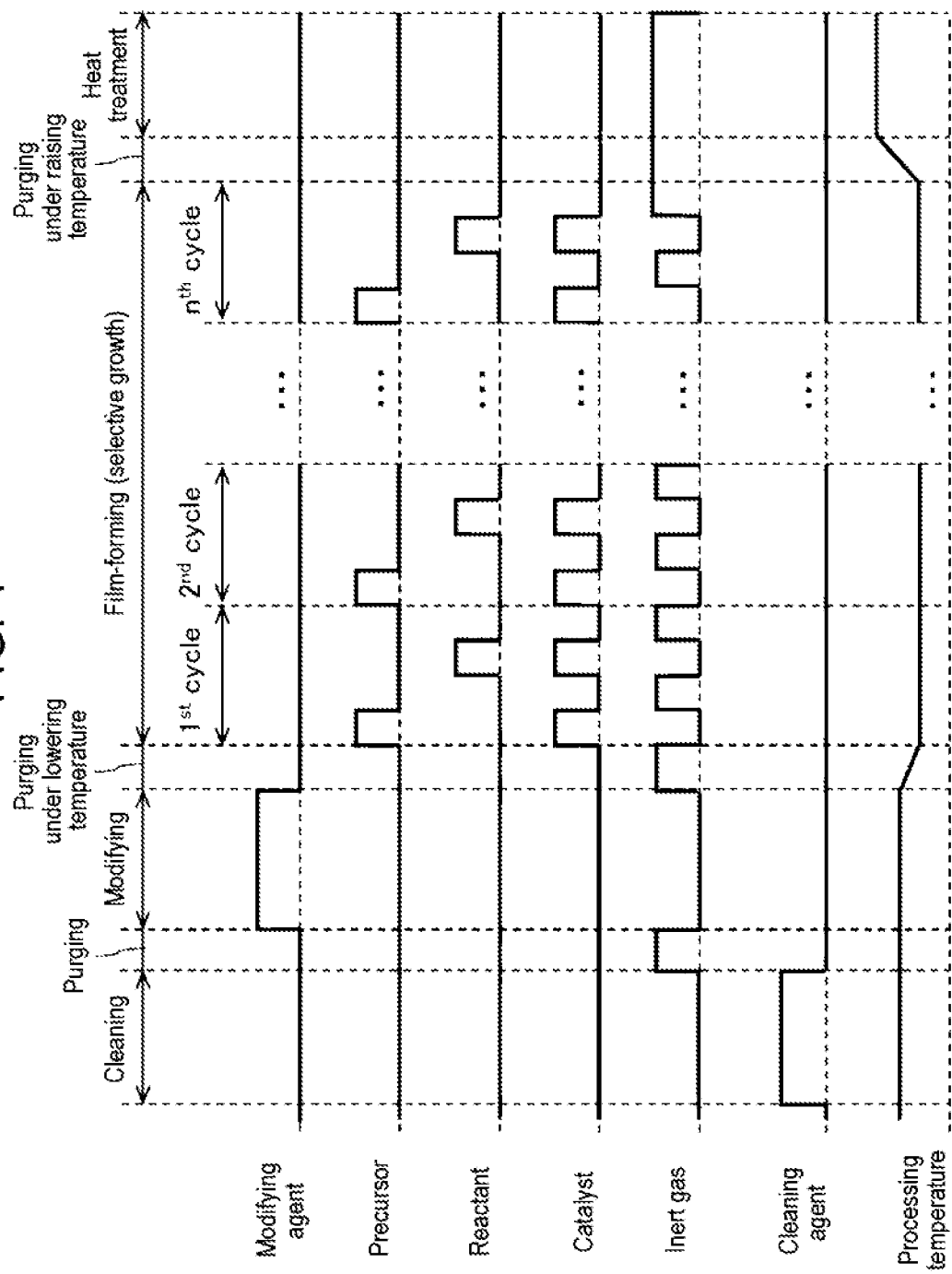
FIG. 4 is a diagram illustrating a processing sequence according to embodiments of the present disclosure.

Further, in the following example, there will be described a case where, as shown in FIG. 4, in the film-forming step, a cycle including performing a step of supplying a precursor to the wafer 200 and a step of supplying a reactant to the wafer 200 is performed a predetermined number of times, and a catalyst is supplied to the wafer 200 in at least one selected from the group of the step of supplying the precursor and the step of supplying the reactant. As a representative example, FIG. 4 shows an example in which the catalyst is supplied in both the step of supplying the precursor and the step of supplying the reactant.

That is, in the processing sequence shown in FIG. 4, a step of supplying a modifying agent to a wafer 200 including a first surface and a second surface to form an inhibitor layer on the first surface (modifying step), and a step of forming a film on the second surface by performing a cycle a predetermined number of times (n times where n is an integer of 1 or more), the cycle including performing a step of supplying a precursor and a catalyst to the wafer 200 and a step of supplying a reactant and a catalyst to the wafer 200 (film-forming step) are performed in a non-plasma atmosphere.

In the present disclosure, for the sake of convenience, the processing sequence described above may also be denoted as follows. The same notation applies in the following description of modifications and other embodiments.

Modifying agent→(precursor+catalyst→reactant+catalyst)×n

As in the processing sequences described below, the catalyst may be supplied to the wafer 200 in at least one selected from the group of the step of supplying the precursor and the step of supplying the reactant.

Modifying agent→(precursor+catalyst→reactant)×n

Modifying agent→(precursor→reactant+catalyst)×n

Modifying agent→(precursor+catalyst→reactant+catalyst)×n

Further, as in FIG. 4 and the processing sequences shown below, a step of removing a native oxide film formed on the surface of the wafer 200 by supplying a cleaning agent to the wafer 200 (cleaning step) may be further performed before performing the modifying step. Further, a step of heat-treating the wafer 200 (heat-treating step) may be further performed after performing the step of forming the film.

Cleaning agent→modifying agent→(precursor+catalyst→reactant)×n→heat treatment

Cleaning agent→modifying agent→(precursor→mactant+catalyst)→n→heat treatment

Cleaning agent→modifying agent→(precursor+catalyst→reactant+catalyst)×n→heat treatment The term "wafer" is used herein may refer to "a wafer itself" or "a stacked body of a wafer and a predetermined layer or film formed on the surface of the wafer." The phrase "a surface of a wafer" used herein may refer to "a surface of a wafer itself" or "a surface of a predetermined layer or the like formed on a wafer." The expression "a predetermined layer is formed on a wafer" used herein may mean that "a predetermined layer is directly formed on a surface of a wafer itself" or that "a predetermined layer is formed on a layer or the like formed on a wafer." The term "substrate" used herein may be synonymous with the term "wafer."

As used herein, the term "agent" includes at least one selected from the group of gaseous substance and liquid substance. The liquid substance includes mist substance. That is, each of the modifying agent and the film-forming agent (precursor, reactant, and catalyst) may include gaseous substance, may include liquid substance such as mist substance, or may include both of them.

As used herein, the term "layer" includes at least one selected from the group of a continuous layer and a discontinuous layer. For example, the inhibitor layer may include a continuous layer, may include a discontinuous layer, or may include both of them, as long as the inhibitor layer is capable of exhibiting a film formation inhibition effect.

(Wafer Charging and Boat Loading)

When a plurality of wafers 200 is charged to the boat 217 (wafer charging), the shutter 219s is moved by the shutter opening/closing mechanism 115s to open the lower end opening of the manifold 209 (shutter opening). Thereafter, as shown in FIG. 1, the boat 217 supporting the plurality of wafers 200 is lifted by the boat elevator 115 and loaded into the process chamber 201 (boat loading). In this state, the seal cap 219 seals the lower end of the manifold 209 via the O-ring 220b. Thus, the wafers 200 are provided inside the process chamber 201.

Figure 5A:
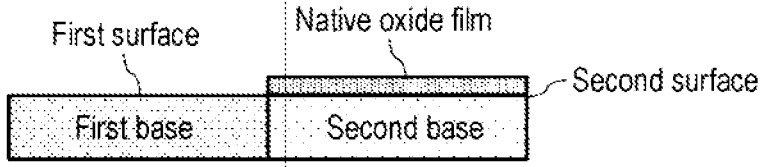
FIG. 5A is a schematic cross-sectional view showing a surface of a wafer including a first surface and a second surface with a native oxide film formed on the second surface.

As shown in FIG. 5A, each of the wafers 200 charged to the boat 217 includes a first surface and a second surface. The first surface is a surface of a first base, and the second surface is a surface of a second base. As described above, for example, a case where the first surface is a surface of a SiO film as a first base and the second surface is a surface of a SiN film as a second base will be described here. Further, a case where a native oxide film is formed on the second surface as shown in FIG. 5A will be described here.

(Pressure Regulation and Temperature Regulation)

After the boat loading is completed, the inside of the process chamber 201, which is a space where the wafer 200 are placed, is vacuum-exhausted (decompression-exhausted) by the vacuum pump 246 to reach a desired pressure (state of vacuum). In this operation, the pressure inside the process chamber 201 is measured by the pressure sensor 245, and the APC valve 244 is feedback-controlled based on the measured pressure information. Further, the wafers 200 in the process chamber 201 are heated by the heater 207 to reach a desired processing temperature. In this operation, a state of supplying electric power to the heater 207 is feedback-controlled based on the temperature information detected by the temperature sensor 263 such that a temperature distribution in the process chamber 201 becomes a desired temperature distribution. Further, the rotation of the wafers 200 by the rotator 267 is started. The exhaust of the interior of the process chamber 201 and the heating and rotation of the wafers 200 may be continuously performed at least until the processing on the wafer 200 is completed.

(Cleaning Step)

Thereafter, a cleaning agent is supplied to the wafer 200. Specifically, the valve 243e is opened to allow a cleaning agent to flow into the gas supply pipe 232e. The flow rate of the cleaning agent is regulated by the MFC 241e. The cleaning agent is supplied into the process chamber 201 via the gas supply pipe 232b and the nozzle 249b, and is exhausted via the exhaust port 231a. In this operation, the cleaning agent is supplied to the wafer 200 from the lateral side of the wafer 200 (cleaning agent supply). In this operation, the valves 243f to 243h may be opened to supply an inert gas into the process chamber 201 via the nozzles 249a to 249c.

Figure 5B:
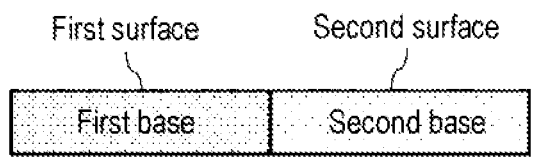
FIG. 5B is a schematic cross-sectional view showing the surface of the wafer after the native oxide film is removed from the second surface by performing a cleaning step from a state of FIG. 5A.

By supplying the cleaning agent to the wafer 200 under processing conditions to be described later, as shown in FIG. 5B, the native oxide film formed on the second surface of the wafer 200 may be removed (etched) and the second surface may be exposed. In this operation, as shown in FIG. 5B, the surface of the first base and the surface of the second base of the wafer 200, that is, the first surface and the second surface are exposed. In a case where the first base is a SiO film and the second base is a SiN film, when the first surface and the second surface are exposed, the first surface is OH-terminated over the entire region thereof, and the second surface is not OH-terminated over the most region thereof. That is, the entire region of the first surface is terminated with OH groups, and the most region of the second surface is not terminated with OH groups.

Processing conditions when supplying the cleaning agent in the cleaning step are exemplified as follows.

Processing temperature: 50 to 200 degrees C., specifically 70 to 150 degrees C.

Processing pressure: 10 to 2000 Pa, specifically 100 to 1500 Pa

Processing time: 10 to 60 minutes, specifically 30 to 60 minutes

Cleaning agent supply flow rate: 0.05 to 1 slm, specifically 0.1 to 0.5 slm

Inert gas supply flow rate (for each gas supply pipe): 1 to 10 slm, specifically 2 to 10 slm Further, as used herein, an expression of a numerical range such as "50 to 200 degrees C." means that the lower limit and the upper limit are included in the range. Therefore, for example, "50 to 200 degrees C." means "50 degrees C. or more and 200 degrees C. or less." The same applies to other numerical ranges. Further, as used herein, the term processing temperature means the temperature of the wafer 200 or the temperature inside the process chamber 201, and the term processing pressure means the pressure inside the process chamber 201. Moreover, the term processing time means the time during which the processing is continued. In addition, when 0 slm is included in the supply flow rate, the term 0 slm means a case where the substance (gas) is not supplied. The same applies the following description.

After removing the native oxide film from the second surface and exposing the second surface, the valve 243e is closed to stop the supply of the cleaning agent into the process chamber 201. Then, the inside of the process chamber 201 is vacuum-exhausted to remove gaseous substances and the like remaining in the process chamber 201 from the process chamber 201. At this time, the valves 243f to 243h are opened to supply an inert gas into the process chamber 201 via the nozzles 249a to 249c. The inert gas supplied from the nozzles 249a to 249c acts as a purge gas, thus purging the inside of the process chamber 201 (purging).

Processing conditions when purging is performed in the cleaning step are exemplified as follows:

Processing pressure: 1 to 30 Pa

Processing time: 1 to 120 seconds, specifically 1 to 60 seconds

Inert gas supply flow rate (for each gas supply pipe): 0.5 to 20 slm.

The processing temperature when the purging is performed in this step may be the same as the processing temperature when supplying the cleaning agent.

As the cleaning agent, for example, a fluorine (F)-containing gas may be used. As the F-containing gas, for example, a chlorine trifluoride ($ClF_3$) gas, a chlorine fluoride (ClF) gas, a nitrogen fluoride ($NF_3$) gas, a hydrogen fluoride (HF) gas, a fluorine ($F_2$) gas, and the like may be used. As the cleaning agent, for example, an acetic acid ($CH_3COOH$) gas, a formic acid (HCOOH) gas, a hexafluoroacetylacetone ($C_5H_2F_6O_2$) gas, a hydrogen ($H_2$) gas, or the like may be used. Various cleaning liquids may also be used as the cleaning agent. For example, an aqueous acetic acid solution, an aqueous formic acid solution, or the like may be used as the cleaning agent. Alternatively, for example, DHF cleaning may be performed by using a HF aqueous solution as the cleaning agent. Further, for example, SC-1 cleaning (APM cleaning) may be performed by using a cleaning liquid containing ammonia water, hydrogen peroxide water, and pure water as the cleaning agent. Moreover, for example, SC-2 cleaning (HPM cleaning) may be performed by using a cleaning liquid containing hydrochloric acid, hydrogen peroxide water, and pure water as the cleaning agent. Alternatively, for example, SPM cleaning may be performed by using a cleaning liquid containing sulfuric acid and hydrogen peroxide water as the cleaning agent. That is, the cleaning agent may be gaseous substance or liquid substance. Further, the cleaning agent may be liquid substance such as a mist substance. One or more selected from the group of the substances may be used as the cleaning agent.

As the inert gas, for example, a rare gas such as a nitrogen ($N_2$) gas, an argon (Ar) gas, a helium (He) gas, a neon (Ne) gas, and a xenon (Xe) gas may be used. As the inert gas, one or more selected from the group of these gases may be used. The same applies in each step described below.

In the case of using the wafer 200 from which the native oxide film formed on the surface of the wafer 200 is removed in advance, the cleaning step may be omitted. In that case, the modifying step described below, is performed after pressure regulation and temperature regulation.

(Modifying Step)

After performing the cleaning step, a modifying agent is supplied to the wafer 200.

Specifically, the valve 243a is opened to allow the modifying agent to flow into the gas supply pipe 232a. The flow rate of the modifying agent is regulated by the MFC 241a. The modifying agent is supplied into the process chamber 201 via the nozzle 249a, and is exhausted via the exhaust port 231a. In this operation, the modifying agent is supplied to the wafer 200 from the lateral side of the wafer 200 (modifying agent supply). In this operation, the valves 243f to 243h may be opened to supply an inert gas into the process chamber 201 via the nozzles 249a to 249c.

Figure 5C:
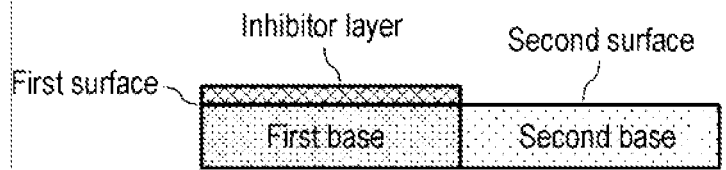
FIG. 5C is a schematic cross-sectional view showing the surface of the wafer after an inhibitor layer is formed on the first surface by performing a modifying step from a state of FIG. 5B.

By supplying the modifying agent to the wafer 200 under the processing conditions described below, as shown in FIG. 5C, the inhibitor molecules, which are at least a portion of the molecular structure of the molecules constituting the modifying agent, may be caused to be chemisorbed on the first surface of the wafer 200 to modify the first surface to form an inhibitor layer on the first surface. That is, in this step, by supplying the modifying agent reacting with the first surface to the wafer 200, the inhibitor molecules contained in the modifying agent may be caused to be adsorbed on the first surface to form an inhibitor layer on the first surface. Thus, the first surface, which is the outermost surface of the first base, may be terminated with the inhibitor molecules which are at least a portion of the molecular structure of the molecules constituting the modifying agent. The inhibitor molecule is also referred to as a film formation inhibitor molecule (an adsorption inhibitor molecule or a reaction inhibitor molecule). Further, the inhibitor layer is also referred to as a film formation inhibition layer (an adsorption inhibition layer or a reaction inhibition layer).

The inhibitor layer formed in this step contains at least a portion of the molecular structure of the molecules constituting the modifying agent, which are residues derived from the modifying agent. The inhibitor layer prevents adsorption of the precursor (film-forming agent) on the first surface and inhibits (suppresses) progress of the film-forming reaction on the first surface in the film-forming step described below.

At least a portion of the molecular structure of the molecules that constitute the modifying agent, that is, the inhibitor molecules may be, for example, trialkylsilyl groups such as trimethylsilyl groups (—SiMe$_3$) and triethylsilyl groups (—SiEt$_3$). The trialkylsilyl groups include alkyl groups, that is, hydrocarbon groups. In these cases, Si of the trimethylsilyl groups or the triethylsilyl groups is adsorbed on the adsorption sites on the first surface of the wafer 200. When the first surface is a surface of a SiO film, the first surface contains OH terminations (OH groups) as adsorption sites. Si of the trimethylsilyl groups or the triethylsilyl groups is bonded O of the OH terminations (OH groups) on the first surface, and the first surface is terminated with alkyl groups such as methyl groups or ethyl groups, that is, with hydrocarbon groups. The alkyl groups (alkylsilyl groups) such as methyl groups (trimethylsilyl groups) or ethyl groups (triethylsilyl groups), that is, the hydrocarbon groups, which terminate the first surface, constitute the inhibitor layer. In the film-forming step described below, the inhibitor layer may prevent adsorption of the precursor (film-forming agent) on the first surface and may inhibit (suppress) progress of the film-forming reaction on the first surface.

Figure 6A:
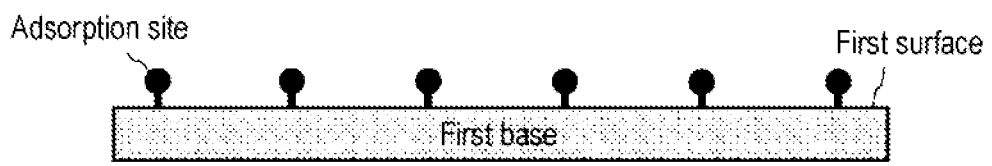
FIG. 6A is a schematic cross-sectional view showing adsorption sites on the first surface of the wafer before a modifying agent is supplied.
Figure 6B:
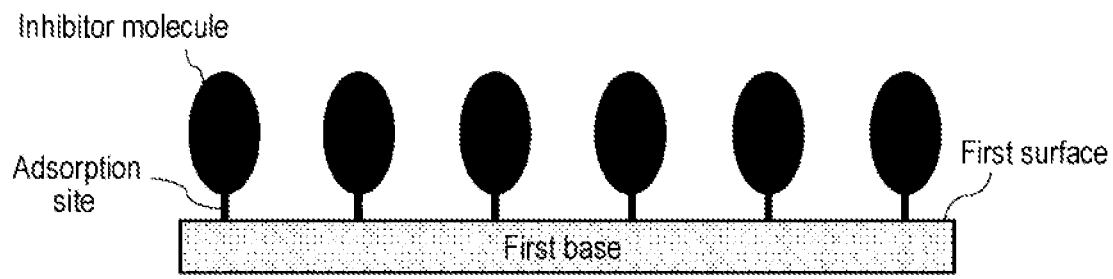
FIG. 6B is a schematic cross-sectional view showing a state in which inhibitor molecules are adsorbed to the adsorption sites on the first surface of the wafer.
Figure 6C:
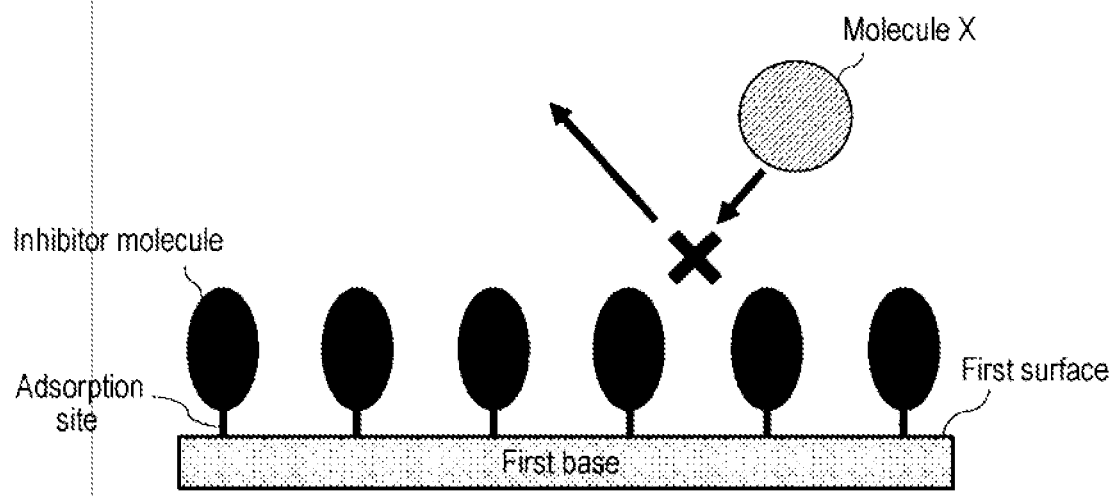
FIG. 6C is a schematic cross-sectional diagram showing a state in which the inhibitor molecules become steric hindrance to a molecule X constituting a predetermined substance contained in a film-forming agent and hinder the molecule X from passing through a gap between the inhibitor molecules and reaching the first surface of the wafer.

FIG. 6A shows the adsorption sites (e.g., OH groups) on the first surface of the wafer 200 before the modifying agent is supplied thereto, and FIG. 6B shows a state in which the inhibitor molecules are adsorbed on the adsorption sites on the first surface of the wafer 200. In the above-described example, the adsorption sites on the first surface in FIG. 6A correspond to the OH groups, and the inhibitor molecules adsorbed on the adsorption sites on the first surface in FIG. 6B correspond to the trialkylsilyl groups such as trimethylsilyl groups (—SiMe$_3$) or triethylsilyl groups (—SiEt$_3$). That is, in this example, the inhibitor molecules contain alkyl groups (alkylsilyl groups), and the inhibitor layer contains alkyl group (alkylsilyl group) terminations, that is, hydrocarbon group terminations. The alkyl group (alkylsilyl group) terminations and the hydrocarbon group terminations are also referred to as alkyl (alkylsilyl) terminations and hydrocarbon terminations, respectively. In this example, a high film formation inhibition effect is obtained.

In this step, at least a portion of the molecular structure of the molecules constituting the modifying agent may be adsorbed to a portion of the second surface of the wafer 200. However, an amount of the adsorption on the second surface is small. An amount of the adsorption on the first surface of the wafer 200 is overwhelmingly large. The reason why such selective (preferential) adsorption is possible is that the processing conditions in this step are set such that the modifying agent is not decomposed in a gas phase in the process chamber 201. Further, this is because while the entire region of the first surface is OH-terminated, the most region of the second surface is not OH-terminated. In this step, since the modifying agent is not decomposed in a gas phase in the process chamber 201, at least a portion of the molecular structure of the molecules constituting the modifying agent is not multiple-deposited on the first surface and the second surface. At least a portion of the molecular structure of the molecules constituting the modifying agent is selectively adsorbed to the first surface, whereby the first surface is selectively terminated by at least a portion of the molecular structure of the molecules constituting the modifying agent.

Processing conditions when supplying the modifying agent in the modifying step are exemplified as follows:

Processing temperature: room temperature (25 degrees C.) to 500 degrees C., specifically room temperature to 250 degrees C.

Processing pressure: 5 to 2000 Pa, specifically 10 to 1000 Pa

Processing time: 1 second to 120 minutes, specifically 30 seconds to 60 minutes

Modifying agent supply flow rate: 0.001 to 3 slm, specifically 0.001 to 0.5 slm

Inert gas supply flow rate (for each gas supply pipe): 0 to 20 slm

After selectively forming the inhibitor layer on the first surface of the wafer 200, the valve 243a is closed to stop the supply of the modifying agent into the process chamber 201. Then, gaseous substances and the like remaining in the process chamber 201 are removed from the process chamber 201 by the same processing procedures and processing conditions as the purging in the cleaning step (purging). Further, the processing temperature when performing the purging in this step may be the same as the processing temperature when supplying the modifying agent.

As the modifying agent, for example, a compound containing a structure in which amino groups are directly bonded to silicon (Si) or a compound containing a structure in which amino groups and alkyl groups are directly bonded to silicon (Si) may be used.

Examples of the modifying agent may include (dimethylamino)trimethylsilane ((CH$_3$)$_2$NSi(CH$_3$)$_3$, abbreviation: DMATMS), (diethylamino)triethylsilane ((C$_2$H$_5$)$_2$NSi(C$_2$H$_5$)$_3$, abbreviation: DEATES), (dimethylamino)triethylsilane ((CH$_3$)$_2$NSi(C$_2$H$_5$)$_3$, abbreviation: DMATES), (diethylamino)trimethylsilane ((C$_2$H$_5$)$_2$NSi(CH$_3$)$_3$, abbreviation: DEATMS), (dipropylamino)trimethylsilane ((C$_3$H$_7$)$_2$NSi(CH$_3$)$_3$, abbreviation: DPATMS), (dibutylamino)trimethylsilane ((C$_4$H$_9$)$_2$NSi(CH$_3$)$_3$, abbreviation: DBATMS), (trimethylsilyl)amine ((CH$_3$)$_3$SiNH$_2$, abbreviation: TMSA), (triethylsilyl)amine ((C$_2$H$_5$)$_3$SiNH$_2$, abbreviation: TESA), (dimethylamino)silane ((CH$_3$)$_2$NSiH$_3$, abbreviation: DMAS), (diethylamino)silane ((C$_2$H$_5$)$_2$NSiH$_3$, abbreviation: DEAS), (dipropylamino)silane ((C$_3$H$_7$)$_2$NSiH$_3$, abbreviation: DPAS), (dibutylamino)silane ((C$_4$H$_9$)$_2$NSiH$_3$, abbreviation: DBAS), and the like. One or more selected from the group of these substances may be used as the modifying agent.

Examples of the modifying agent may also include bis(dimethylamino)dimethylsilane ([(CH$_3$)$_2$N]$_2$Si(CH$_3$)$_2$, abbreviation: BDMADMS), bis(diethylamino)diethylsilane ([(C$_2$H$_5$)$_2$N]$_2$Si(C$_2$H$_5$)$_2$, abbreviation: BDEADES), bis(dimethylamino)diethylsilane ([(CH$_3$)$_2$N]$_2$Si(C$_2$H$_5$)$_2$, abbreviation: BDMADES), bis(diethylamino)dimethylsilane ([(C$_2$H$_5$)$_2$N]$_2$Si(CH$_3$)$_2$, abbreviation: BDEADMS), bis(dimethylamino)silane ([(CH$_3$)$_2$N]$_2$SiH$_2$, abbreviation: BDMAS), bis(diethylamino)silane ([(C$_2$H$_5$)$_2$N]$_2$SiH$_2$, abbreviation: BDEAS), bis(dimethylaminodimethylsilyl)ethane ([(CH$_3$)$_2$N(CH$_3$)$_2$Si]$_2$C$_2$H$_6$, abbreviation: BDMADMSE), bis(dipropylamino)silane ([(C$_3$H$_7$)$_2$N]$_2$SiH$_2$, abbreviation: BDPAS), bis(dibutylamino)silane ([(C$_4$H$_9$)$_2$N]$_2$SiH$_2$, abbreviation: BDBAS), bis(dipropylamino)dimethylsilane ([(C$_3$H$_7$)$_2$N]$_2$Si(CH$_3$)$_2$, abbreviation: BDPADMS), bis(dipropylamino)diethylsilane ([(C$_3$H$_7$)$_2$N]$_2$Si(C$_2$H$_5$)$_2$, abbreviation: BDPADES), (dimethylsilyl)diamine ((CH$_3$)$_2$Si(NH$_2$)$_2$, abbreviation: DMSDA), (diethylsilyl)diamine ((C$_2$H$_5$)$_2$Si(NH$_2$)$_2$, abbreviation: DESDA), (dipropylsilyl)diamine ((C$_3$H$_7$)$_2$Si(NH)$_2$, abbreviation: DPSDA), bis(dimethylaminodimethylsilyl)methane ([(CH$_3$)N(CH$_3$)$_2$Si]$_2$CH$_2$, abbreviation: BDMADMSM), bis(dimethylamino)tetramethyldisilane ([(CH$_3$)$_2$N]$_2$(CH$_3$)$_4$Si$_2$, abbreviation: BDMATMDS), and the like. One or more selected from the group of these substances may be used as the modifying agent.

(Film-Forming Step)

After performing the modifying step, a film-forming agent is supplied to the wafer 200 to form a film on the second surface of the wafer 200. That is, a film-forming agent that reacts with the second surface is supplied to the wafer 200 to selectively (preferentially) form a film on the second surface. Specifically, the following precursor supply step and reactant supply step are sequentially executed. In the following example, as described above, the film-forming agent includes a precursor, a reactant, and a catalyst. In the precursor supply step and the reactant supply step, the output of the heater 207 is regulated to maintain a state in which the temperature of the wafer 200 is set to be equal to or lower than the temperature of the wafer 200 in the cleaning step and the modifying step, specifically a state in which the temperature of the wafer 200 is set to be lower than the temperature of the wafer 200 in the cleaning step and the modifying step, as illustrated in FIG. 4.

[Precursor Supply Step]

In this step, a precursor (precursor gas) and a catalyst (catalyst gas) as film-forming agents are supplied to the wafer 200 after performing the modifying step, that is, the wafer 200 after selectively forming the inhibitor layer on the first surface.

Specifically, the valves 243*b* and 243*d* are opened to allow the precursor and the catalyst to flow through the gas supply pipes 232*b* and 232*d*, respectively. The flow rates of the precursor and the catalyst are regulated by the MFCs 241*b* and 241*d*, respectively. The precursor and the catalyst are supplied into the process chamber 201 via the nozzles 249*b* and 249*a*, mixed in the process chamber 201, and exhausted via the exhaust port 231*a*. In this operation, the precursor and the catalyst are supplied to the wafer 200 from the lateral side of the wafer 200 (precursor+catalyst supply). At this time, the valves 243*f* to 243*h* may be opened to supply an inert gas into the process chamber 201 via the nozzles 249*a* to 249*c* respectively.

By supplying the precursor and the catalyst to the wafer 200 under the processing conditions described below, at least a portion of the molecular structure of the molecules constituting the precursor may be selectively chemisorbed on the second surface while suppressing chemisorption of at least a portion of the molecular structure of the molecules constituting the precursor on the first surface. Thus, a first layer is selectively formed on the second surface. The first layer contains at least a portion of the molecular structure of the molecules constituting the precursor, which are residues of the precursor. That is, the first layer contains at least a portion of atoms constituting the precursor.

In this step, by supplying the catalyst together with the precursor, the above-mentioned reaction may proceed in a non-plasma atmosphere and under a low temperature condition as described below. By forming the first layer in the non-plasma atmosphere and under the low temperature condition as described below, the molecules and atoms constituting the inhibitor layer formed on the first surface may be maintained without being extinguished (desorbed) from the first surface.

Further, by forming the first layer in the non-plasma atmosphere and under the low temperature condition as described below, the precursor may be prevented from being thermally decomposed (decomposed in a vapor phase), that is, being pyrolyzed, in the process chamber 201. As a result, the multiple deposition of at least a portion of the molecular structure of the molecules constituting the precursor on the first surface and the second surface may be suppressed, and at least a portion of the molecular structure of the molecules constituting the precursor may be selectively adsorbed on the second surface.

In this step, at least a portion of the molecular structure of the molecules constituting the precursor may be adsorbed on a portion of the first surface of the wafer 200. However, an amount of the adsorption on the first surface is small. An amount of the adsorption on the second surface of the wafer 200 is overwhelmingly large. Such selective (preferential) adsorption is possible because the processing conditions in this step are the low temperature conditions as described below and are the conditions in which the precursor is not decomposed in a vapor phase in the process chamber 201. This is also because the inhibitor layer is formed over the entire region of the first surface whereas the inhibitor layer is not formed over the most region of the second surface.

Processing conditions when supplying the precursor and the catalyst in the precursor supply step are exemplified as follows.

Processing temperature: room temperature (25 degrees C.) to 200 degrees C., specifically room temperature to 150 degrees C.
Processing pressure: 133 to 1333 Pa
Precursor supply flow rate: 0.001 to 2 slm
Catalyst supply flow rate: 0.001 to 2 slm
Inert gas supply flow rate (for each gas supply pipe): 0 to 20 slm
Each gas supply time: 1 to 120 seconds, specifically 1 to 60 seconds After selectively forming the first layer on the second surface of the wafer 200, the valves 243*b* and 243*d* are closed to stop the supply of the precursor and the catalyst into the process chamber 201. Then, gaseous substances and the like remaining in the process chamber 201 are removed from the process chamber 201 by the same processing procedure and processing conditions as the purging in the cleaning step (purging). The processing temperature when the purging is performed in this step may be the same as the processing temperature when supplying the precursor and the catalyst.

As the precursor, for example, a Si- and halogen-containing gas (Si- and halogen-containing substance) may be used. Halogen includes chlorine (Cl), fluorine (F), bromine (Br), iodine (I), and the like. The Si- and halogen-containing gas may contain halogen in the form of a chemical bond between Si and halogen. As the Si- and halogen-containing gas, for example, a silane-based gas containing a Si—Cl bond, that is, a chlorosilane-based gas may be used. The Si- and halogen-containing gas may further contain C, and in this case, the Si- and halogen-containing gas may contain C in the form of the Si—C bond. As the Si- and halogen-containing gas, for example, a silane-based gas containing Si, Cl and an alkylene group and containing the Si—C bond, that is, an alkylenechlorosilane-based gas may be used. The alkylene group includes a methylene group, an ethylene group, a propylene group, a butylene group, and the like. Further, as the Si- and halogen-containing gas, for example, a silane-based gas containing Si, Cl and an alkyl group and containing a Si—C bond, that is, an alkylchlorosilane-based gas may be used. The alkyl group includes a methyl group, an ethyl group, a propyl group, a butyl group, and the like. The Si- and halogen-containing gas may further contain O, and in this case, the Si- and halogen-containing gas may contain O in the form of a Si—O bond, for example, in the form of a siloxane bond (Si—O—Si bond). As the Si- and halogen-containing gas, for example, a silane-based gas containing Si and Cl and containing a siloxane bond, that is, a chlorosiloxane-based gas may be used. These gases may contain Cl in the form of a Si—Cl bond. As the precursor, in addition to these gases, an amino group-containing gas (amino group-containing substance) such as an aminosilane-based gas may be used.

Examples of the precursor include bis(trichlorosilyl)methane (($SiC)_2CH_2$, abbreviation: BTCSM), 1,2-bis(trichlorosilyl)ethane (($SiCl_3)_2C_2H_4$, abbreviation: BTCSE), 1,1,2,2-tetrachloro-1,2-dimethyldisilane (($CH_3)_2Si_2Cl_4$, abbreviation: TCDMDS), 1,2-dichloro-1,1,2,2-tetramethyldisilane (($CH_3)_4Si_2Cl_2$, abbreviation: DCTMDS), 1,1,3,3-tetrachloro-1,3-disilacyclobutane ($C_2H_4Cl_4Si_2$, abbreviation: TCDSCB), and the like. Further, as the precursor, for example, tetrachlorosilane ($SiCl_4$, abbreviation: 4CS), hexachlorodisilane ($Si_2Cl_6$, abbreviation: HCDS), octachlorotrisilane ($Si_3Cl_8$, abbreviation: OCTS), and the like may be used. Further, as the precursor, for example, hexachlorodisiloxane ($Cl_3Si$—O—$SiCl_3$, abbreviation: HCDSO), octachlorotrisiloxane ($Cl_3Si$—O—$SiCl_2$—O—$SiCl_3$, abbreviation: OCTSO), and the like may be used. One or more selected from the group of these substances may be used as the precursor.

Further, as the precursor, tetrakis(dimethylamino)silane ($Si[N(CH_3)_2]_4$, abbreviation: 4DMAS), tris(dimethylamino)silane ($Si[N(CH_3)_2]_3H$, abbreviation: 3DMAS), bis(diethylamino)silane ($Si[N(C_2H_5)_2]_2H_2$, abbreviation: BDEAS), bis(tert-butylamino)silane ($SiH_2[NH(C_4H_9)]_2$, abbreviation: BTBAS), (diisopropylamino)silane ($SiH_3[N(C_3H_7)_2]$, abbreviation: DIPAS), and the like may be used. One or more selected from the group of these substances may be used as the precursor.

As the catalyst, for example, an amine-based gas (amine-based substance) containing carbon (C), nitrogen (N), and hydrogen (H) may be used. As the amine-based gas (amine-based substance), a cyclic amine-based gas (cyclic amine-based substance) or a chain amine-based gas (chain amine-based substance) may be used. As the catalyst, for example, cyclic amines such as pyridine ($C_5H_5N$), aminopyridine ($C_5H_6N_2$), picoline ($C_6H_7N$), lutidine ($C_7H_9N$), pyrimidine ($C_4H_4N_2$), quinoline ($C_9H_7N$), piperazine ($C_4H_{10}N_2$), piperidine ($C_5H_{11}N$), aniline ($C_6H_7N$), and the like may be used. Further, as the catalyst, chain amines such as triethylamine (($C_2H_5)_3N$, abbreviation: TEA), diethylamine (($C_2H_5)_2NH$, abbreviation: DEA), monoethylamine (($C_2H_5)NH_2$, abbreviation: MEA), trimethylamine (($CH_3)_3N$, abbreviation: TMA), dimethylamine (($CH_3)_2NH$, abbreviation: DMA), monomethylamine (($CH_3)NH_2$, abbreviation: MMA), and the like may be used. One or more selected from the group of these substances may be used as the catalyst. The same applies the reactant supply step described later.

[Reactant Supply Step]

After the precursor supply step is completed, a reactant (reaction gas) and a catalyst (catalyst gas) as film-forming agents are supplied to the wafer 200, that is, the wafer 200 after selectively forming the first layer on the second surface. Now, an example in which an oxidizing agent (oxidizing gas) is used as the reactant (reaction gas) will be described.

Specifically, the valves 243c and 243d are opened to allow the reactant and the catalyst to flow through the gas supply pipes 232c and 232d, respectively. Flow rates of the reactant and the catalyst are regulated by the M FCs 241c and 241d, respectively. The reactant and the catalyst are supplied into the process chamber 201 via the nozzles 249c and 249a, mixed in the process chamber 201, and exhausted via the exhaust port 231a. In this operation, the reactant and the catalyst are supplied to the wafer 200 from the lateral side of the wafer 200 (reactant+catalyst supply). At this time, the valves 243f to 243h may be opened to supply an inert gas into the process chamber 201 via the nozzles 249a to 249c respectively.

By supplying the reactant and the catalyst to the wafer 200 under process conditions described below, it is possible to oxidize at least a portion of the first layer formed on the second surface of the wafer 200 in the precursor supply step. As a result, a second layer obtained by oxidizing the first layer is formed on the second surface.

In this step, by supplying the catalyst together with the reactant, it is possible to allow the above-mentioned reaction to proceed in a non-plasma atmosphere and under low-temperature conditions as described below. By forming the second layer in the non-plasma atmosphere and under the low-temperature conditions as described below, the molecules and atoms constituting the inhibitor layer formed on the first surface may be maintained without being extinguished (desorbed) from the first surface.

Process conditions when supplying the reactant and the catalyst in the reactant supply step are exemplified as follows.

Processing temperature: room temperature (25 degrees C.) to 200 degrees C., specifically room temperature to 150 degrees C.
Processing pressure: 133 to 1333 Pa
Reactant supply flow rate: 0.001 to 2 slm
Catalyst supply flow rate: 0.001 to 2 slm
Inert gas supply flow rate (for each gas supply pipe): 0 to 20 slm
Each gas supply time: 1 to 120 seconds, specifically 1 to 60 seconds After the first layer formed on the second surface is oxidized and changed (converted) into the second layer, the valves 243c and 243d are closed to stop the supply of the reactant and the catalyst into the process chamber 201. Then, gaseous substances and the like remaining in the process chamber 201 are removed from the process chamber 201 by the same processing procedures and processing conditions as the purging in the cleaning step (purging). The processing temperature when performing the purging in this step may be the same as the processing temperature when supplying the reactant and the catalyst.

As the reactant, that is, the oxidizing agent, for example, an oxygen (O)- and hydrogen (H)-containing gas (O- and H-containing substance) may be used. As the O- and H-containing gas, for example, a water vapor ($H_2O$ gas), a hydrogen peroxide ($H_2O_2$) gas, a hydrogen ($H_2$) gas+oxygen ($O_2$) gas, a $H_2$ gas+ozone ($O_3$) gas, and the like may be used. That is, an O-containing gas+H-containing gas may also be used as the O- and H-containing gas. In this case, as the H-containing gas, a deuterium ($D_2$) gas may be used instead of the $H_2$ gas. One or more selected from the group of these substances may be used as the reactant.

The parallel notation of two gases such as "$H_2$ gas+$O_2$ gas" in the present disclosure means a mixed gas of $H_2$ gas and $O_2$ gas. When supplying the mixed gas, the two gases may be mixed (premixed) in the supply pipe and then supplied into the process chamber 201, or the two gases may be separately supplied to the process chamber 201 via different supply pipes and then mixed (post-mixed) in the process chamber 201.

In addition to the O- and H-containing gas, an O-containing gas (O-containing substance) may be used as the reactant, that is, the oxidizing agent. As the O-containing gas, for example, an $O_2$ gas, an $O_3$ gas), a nitrous oxide ($N_2O$) gas, a nitric oxide (NO) gas, a nitrogen dioxide ($NO_2$) gas, a carbon monoxide (CO) gas, a carbon dioxide ($CO_2$) gas, and the like may be used. As the reactant, that is, the oxidizing agent, in addition to these gases, various aqueous solutions and various cleaning liquids described above may also be used. In this case, an oxidation object on the surface of the wafer 200 may be oxidized by exposing the wafer 200 to the cleaning liquid. One or more selected from the group of these substances may be used as the reactant.

As the catalyst, for example, catalysts similar to the various catalysts exemplified in the above-described precursor supply step may be used.

[Performing a Predetermined Number of Times]

Figure 5D:
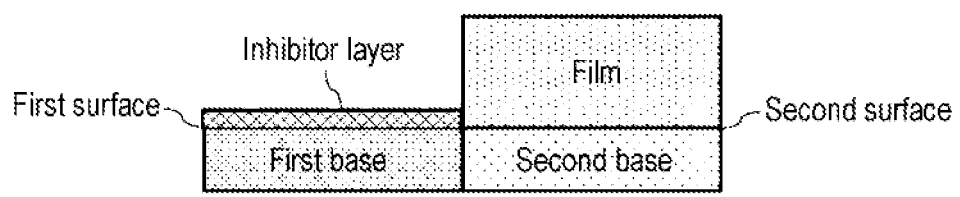
FIG. 5D is a schematic cross-sectional view showing the surface of the wafer after a film is selectively formed on the second surface by performing a film-forming step from a state of FIG. 5C.

By performing, a predetermined number of time (n times where n is an integer of 1 or more), a cycle in which the precursor supply step and the reactant supply step are performed alternately in a non-simultaneous manner, that is, without synchronization, as shown in FIG. 5D, it is possible to selectively (preferentially) form a film on the second surface of the wafer 200. For example, when using the precursor, the reactant, and the catalyst described above, a silicon oxycarbide film (SiOC film) or a silicon oxide film (SiO film) may be selectively grown as a film on the second surface. The above-described cycle may be performed a plurality of times. That is, a thickness of the second layer formed per cycle may be set to be smaller than a desired film thickness, and the above-described cycle may be performed a plurality of times until a film thickness of a film formed by stacking the second layers reaches a desired film thickness.

As described above, the film may be selectively grown on the second surface of the wafer 200 by performing the above-described cycle the predetermined number of times. At this time, since the inhibitor layer is formed on the first surface of the wafer 200, growth of the film on the first surface may be suppressed. That is, by performing the above-described cycle the predetermined number of times, it is possible to promote the growth of the film on the second surface while suppressing the growth of the film on the first surface.

However, even when the inhibitor layer is formed on the first surface of the wafer 200, the selectivity in selective growth may deteriorate depending on a relationship between the molecular size of the inhibitor molecule, the molecular size of the molecule constituting the predetermined substance contained in the film-forming agent, and the spacing of the adsorption sites of the first surface. That is, depending on the relationship, it may be difficult to selectively form a film on the second surface with high accuracy.

Figure 7:
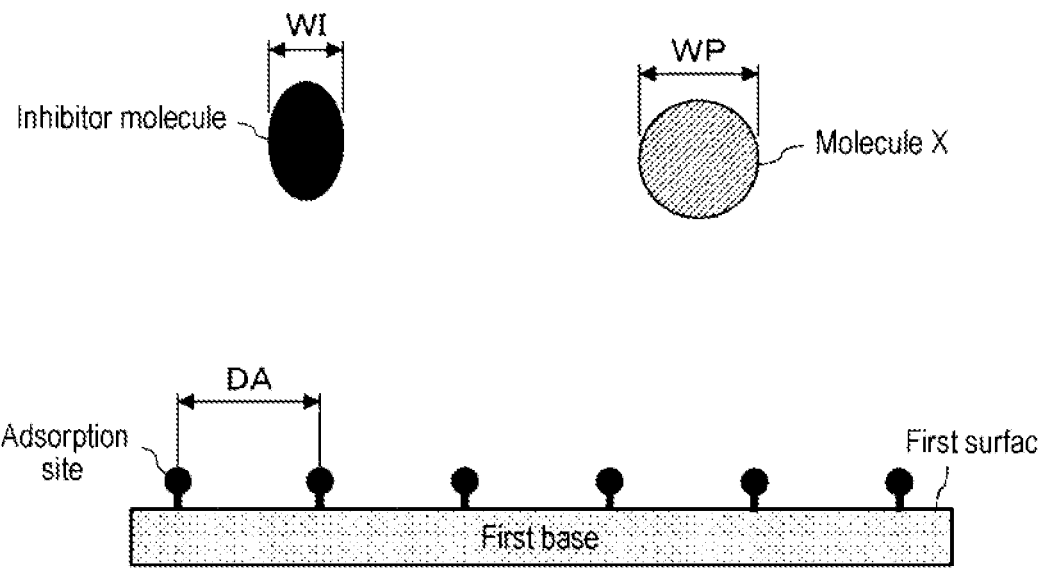
FIG. 7 is a schematic cross-sectional diagram illustrating a state in which WP>DA−WI is satisfied when WI is smaller than DA, where WI is a width of the inhibitor molecule, DA is a spacing of the adsorption sites on the first surface of the wafer, and WP is a width of the molecule X constituting the predetermined substance contained in the film-forming agent.
Figure 8:
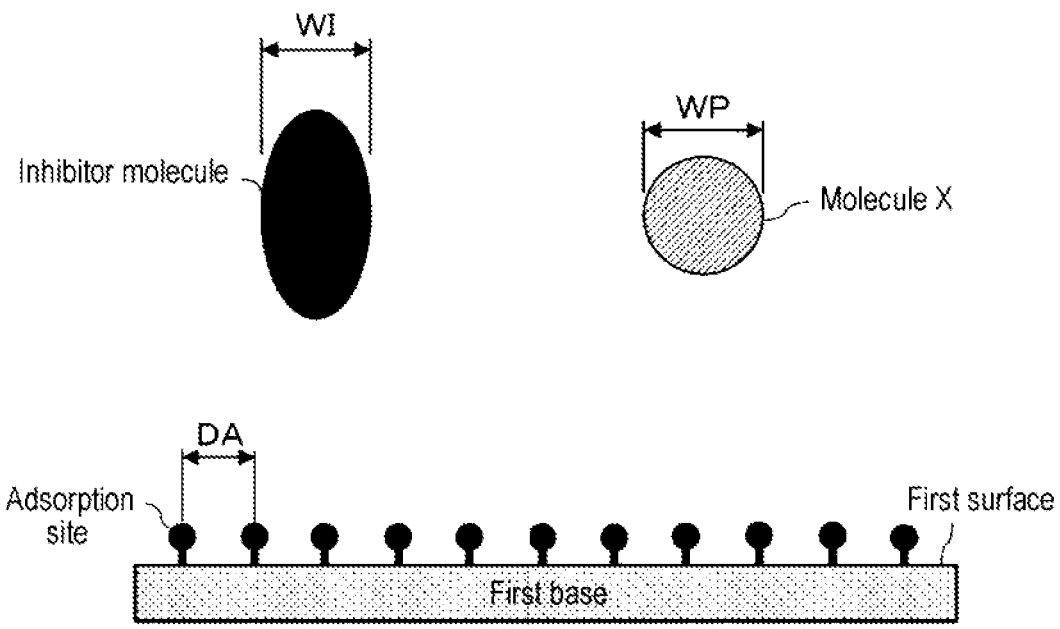
FIG. 8 is a schematic cross-sectional diagram illustrating a state in which WP>DAx−WI (where x is the smallest integer that satisfies WI<DAx) is satisfied when WI is larger than DA, where WI is a width of the inhibitor molecule, DA is a spacing of the adsorption sites on the first surface of the wafer, and WP is a width of the molecule X constituting the predetermined substance contained in the film-forming agent.

Considering the above-described matter, in the embodiments of the present disclosure, as shown in FIGS. 7 and 8, WP>DA−WI is satisfied when WI is smaller than DA, and WP>DAx−WI (where x is the smallest integer that satisfies WI<DAx) is satisfied when WI is larger than DA, where WI is a width of the inhibitor molecule constituting the inhibitor layer, DA is a spacing of adsorption sites (for example, a spacing of OH groups) on the first surface, and WP is a width of a molecule X (precursor molecule) constituting the precursor as a predetermined substance contained in the film-forming agent.

For example, a type of at least one selected from the group of modifying agent and precursor is chosen (selected) to satisfy the above-described relational expressions. For example, a modifying agent with a desired WI is selected and used to satisfy the relational expressions. Further, for example, a precursor with a desired WP is selected and used to satisfy these relational expressions. Further, for example, a modifying agent with a desired WI and a precursor with a desired WP are selected and used to satisfy the relational expressions. Further, for example, the state of the adsorption sites on the first surface (spacing, density, and the like of the adsorption sites) is regulated to satisfy the relational expressions. Further, for example, the state of the adsorption sites on the first surface is regulated and the modifying agent with a desired WI is selected and used to satisfy the relational expressions. Further, for example, the state of the adsorption sites on the first surface is regulated and the precursor with a desired WP is selected and used to satisfy the relational expressions. Further, for example, the state of the adsorption sites on the first surface is regulated and the modifying agent with a desired WI and the precursor with a desired WP are selected and used to satisfy the relational expressions Specifically, for example, the type of modifying agent is selected to satisfy DA>WI and WP>DA−WI or DA<WI and WP>DAx−WI. Further, for example, the type of precursor is selected to satisfy DA>WI and WP>DA−WI or DA<WI and WP>DAx−WI. Further, for example, the types of modifying agent and precursor are selected to satisfy DA>WI and WP>DA−WI or DA<WI and WP>DAx−WI.

Further, for example, the spacing (density) of the adsorption sites on the first surface is regulated to satisfy DA>WI and WP>DA−WI. Further, for example, the spacing (density) of the adsorption sites on the first surface is regulated and the type of modifying agent is selected to satisfy DA>WI and WP>DA−WI. Further, for example, the spacing (density) of the adsorption sites on the first surface is regulated and the type of precursor is selected to satisfy DA>WI and WP>DA−WI. Further, for example, the spacing (density) of the adsorption sites on the first surface is regulated and the types of modifying agent and precursor are selected to satisfy DA>WI and WP>DA−WI.

Further, for example, the spacing (density) of the adsorption sites on the first surface is regulated to satisfy DA<WI and WP>DAx−WI. Further, for example, the spacing (density) of the adsorption sites on the first surface is regulated and the type of modifying agent is selected to satisfy DA<WI and WP>DAx−WI. Further, for example, the spacing (density) of the adsorption sites on the first surface is regulated and the type of precursor is selected to satisfy DA<WI and WP>DAx−WI. Further, for example, the spacing (density) of the adsorption sites on the first surface is regulated and the types of modifying agent and precursor are selected to satisfy DA<WI and WP>DAx−WI.

Further, the spacing, density, and the like of the adsorption sites on the first surface may be regulated, for example, by using the cleaning agent in the cleaning step, that is, by the cleaning process. That is, it is possible to regulate the spacing, density, and the like of the adsorption sites on the first surface by the cleaning process.

By performing at least one selected from the group of the selection of the type of modifying agent, the selection of the type of precursor, and the regulation of the adsorption sites on the first surface to satisfy the relational expressions as described above, as shown in FIG. 6C, the inhibitor molecules effectively act as a steric hindrance to the molecules X (precursor molecules). This makes it possible to prevent the molecules X (precursor molecules) from passing through the gaps between the inhibitor molecules and reaching the first surface. As a result, it is possible to suppress the precursor as the predetermined substance contained in the film-forming agent from contacting the first surface, and it is possible to suppress the adsorption (chemisorption and physisorption) of the precursor on the first surface.

In this case, even in a case where a catalyst with a small molecular size is used and allowed to pass through the gap between the inhibitor molecules and reach the first surface, it is possible to suppress the precursor from contacting the first surface, thereby suppressing the precursor from being adsorbed on the first surface, that is, suppressing the first layer from being formed on the first surface. In this case, even in a case where a reactant with a small molecular size is used and allowed to pass through the gaps between the inhibitor molecules and reach the first surface, it is possible to suppress the precursor from contacting the first surface, that is, it is possible to suppress the precursor from being adsorbed on the first surface, thereby suppressing the second layer from being formed on the first surface. As a result, it is possible to suppress an occurrence of selection failure. Further, by suppressing the precursor contacting the first surface, even when a highly-reactive substance is used as the precursor, it is possible to suppress reaction between the precursor and the first surface, thereby suppressing the resultant desorption of the inhibitor molecules and the consequent selection failure.

Figure 9:
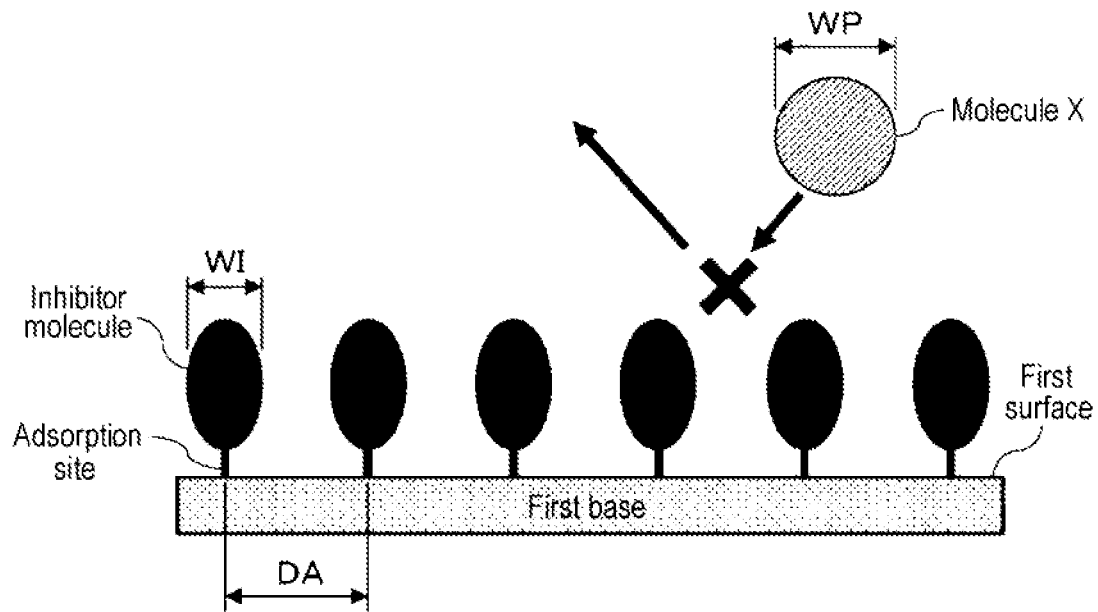
FIG. 9 is a schematic cross-sectional diagram illustrating a state in which the inhibitor molecules become steric hindrance to the molecule X and hinder the molecule X from passing through a gap between the inhibitor molecules and reaching the first surface by establishing a state in which WP>DA−WI is satisfied, when WI is smaller than DA, where WI is a width of the inhibitor molecules, DA is a spacing of the adsorption sites on the first surface of the wafer, and WP is a width of the molecule X constituting the predetermined substance contained in the film-forming agent.

By satisfying WP>DA−WI when WI is smaller than DA as shown in FIG. 7, the inhibitor molecules effectively act as a steric hindrance to the molecules X (precursor molecules) as shown in FIG. 9. As a result, it is possible to sufficiently hinder the molecules X (precursor molecules) from passing through the gaps between the inhibitor molecules and reaching the first surface (hereinafter, this effect is also referred to as blocking effect). This makes it possible to obtain the above-described effects.

Figure 10:
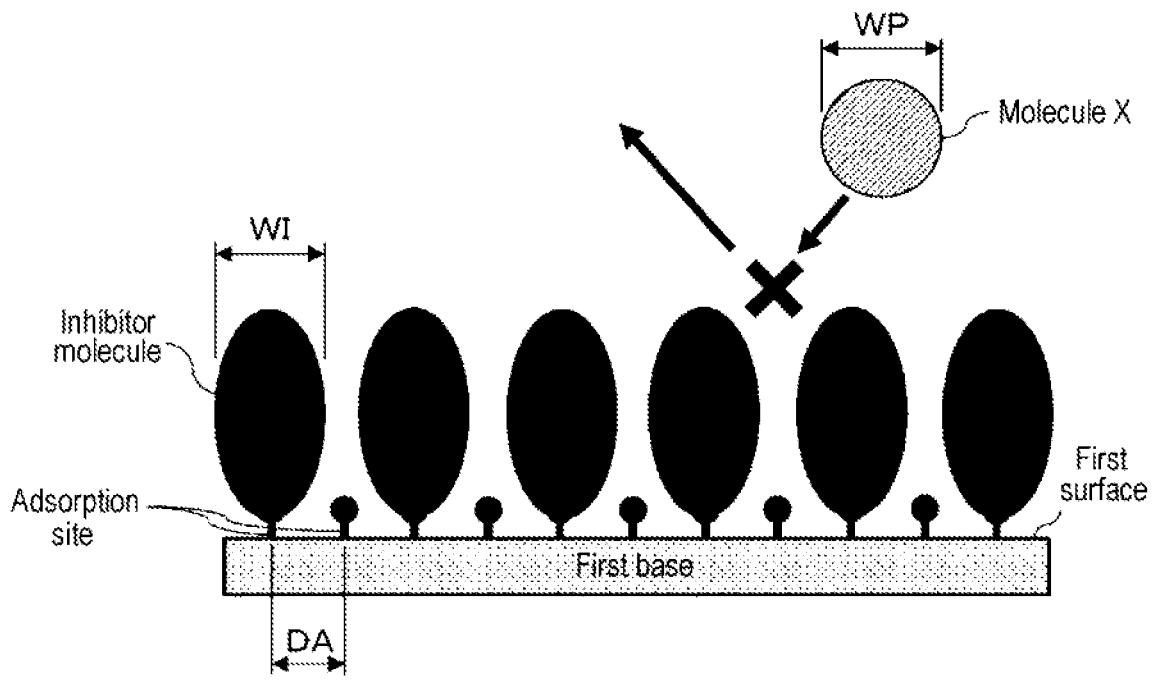
FIG. 10 is a schematic cross-sectional diagram illustrating a state in which the inhibitor molecules become steric hindrance to the molecule X and hinder the molecule X from passing through a gap between the inhibitor molecules and reaching the first surface by establishing a state in which WP>DAx−WI (where x is the smallest integer that satisfies WI<DAx) is satisfied, when WI is larger than DA, where WI is a width of the inhibitor molecules, DA is a spacing of the adsorption sites on the first surface of the wafer, and WP is a width of the molecule X constituting the predetermined substance contained in the film-forming agent.

Further, by satisfying WP>DAx−WI (where x is the smallest integer that satisfies WI<DAx) when WI is larger than DA as shown in FIG. 8, the inhibitor molecules effectively act as a steric hindrance to the molecules X (precursor molecules) as shown in FIG. 10. As a result, it becomes possible to sufficiently hinder the molecules X (precursor molecules) from passing through the gaps between the inhibitor molecules and reaching the first surface. This makes it possible to obtain the above-described effects.

In the above-described relational expressions, the width (WI) of the inhibitor molecule may be a maximum width of the inhibitor molecule. However, the width (WI) of the inhibitor molecule may be an average width of the inhibitor molecule in some embodiments, and may be a minimum width of the inhibitor molecule in some embodiments. In the above-described relational expressions, the width (WP) of the molecule X may be the maximum width of the molecule X. However, the width (WP) of the molecule X may be an average width of the molecules X in some embodiments, and may be a minimum width of the molecule X in some embodiments.

In a case where the width (WI) of the inhibitor molecule is the minimum width of the inhibitor molecule, when the width (WP) of the molecule X is set to the minimum width of the molecule X, it is possible to maximize the above-described blocking effect. Further, in a case where the width (WI) of the inhibitor molecule is the minimum width of the inhibitor molecule, even when the width (WP) of the molecule X is set to the average width of the molecule X, it is possible to sufficiently obtain the above-described blocking effect. Further, in a case where the width (WI) of the inhibitor molecule is the minimum width of the inhibitor molecule, even when the width (WP) of the molecule X is set to the maximum width of the molecule X, it is possible to sufficiently obtain the above-described blocking effect. Further, in a case where the width (WI) of the inhibitor molecule is the maximum width of the inhibitor molecule, even when the width (WP) of the molecule X is set to the minimum width of the molecule X, it is possible to sufficiently obtain the above-described blocking effect. Further, in a case where the width (WI) of the inhibitor molecule is the maximum width of the inhibitor molecule, even when the width (WP) of the molecule X is set to the average width of the molecule X, it is possible to sufficiently obtain the above-described blocking effect. Further, in a case where the width (WI) of the inhibitor molecule is the maximum width of the inhibitor molecule, even when the width (WP) of the molecule X is set to the maximum width of the molecule X, the above-described blocking effect may be obtained to some extent.

By the way, when performing the precursor supply step and the reactant supply step, the inhibitor layer formed on the first surface is maintained on the first surface as described above. Therefore, it is possible to suppress growth of a film on the first surface. However, in such a case where the formation of the inhibitor layer on the first surface becomes insufficient due to some reasons, the formation and growth of a film on the first surface may occur very slightly. However, even in this case, the thickness of the film formed on the first surface is much smaller than the thickness of the film formed on the second surface. In the present disclosure, the expression "selectivity is high in selective growth" means a case where no film is formed on the first surface and a film is formed on the second surface and a case where a very thin film is formed on the first surface and a film much thicker than the very thin film is formed on the second surface.

(Heat Treatment Step)

After performing the film-forming step, a heat treatment is performed on the wafer 200 subjected to the selective formation of the film on the second surface of the wafer 200. In this operation, the output of the heater 207 is regulated such that the temperature in the process chamber 201, that is, the temperature of the wafer 200 subjected to the selective formation of the film on the second surface may be set to be equal to or higher than, specifically higher than the temperature of the wafer 200 in the cleaning step, the modifying step, and the film-forming step.

By performing a heat treatment on the wafer 200 (annealing), it is possible to remove impurities contained in the film formed on the second surface of the wafer 200 in the film-forming step and repair defects, thereby hardening the film. By hardening the film, it is possible to improve a processing resistance, that is, an etching resistance of the film. Further, in a case where removal of impurities, repair of defects, hardening of the film, or the like may not be performed on the film formed on the second surface, the annealing process, that is, the heat treatment step may not be performed.

Further, according to this step, it is possible to heat-treat (anneal) the inhibitor layer remaining on the first surface of the wafer 200 after the film-forming step is performed. Thus, at least a portion of the inhibitor layer remaining on the first surface may be desorbed and/or nullified. The expression "nullifying the inhibitor layer" means that the molecular structure of the molecules constituting the inhibitor layer, the arrangement structure of the atoms constituting the inhibitor layer, and the like are changed to enable adsorption of the film-forming agent on the first surface and reaction between the first surface and the film-forming agent.

Figure 5E:
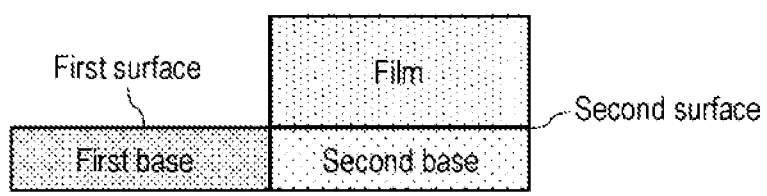
FIG. 5E is a schematic cross-sectional view showing the surface of the wafer after the inhibitor layer on the first surface is removed by performing a heat treatment step from a state of FIG. 5D.

By performing this step as described above, as shown in FIG. 5E, the film formed on the second surface of the wafer 200 is hardened by the heat treatment, and at least a portion of the inhibitor layer formed on the first surface of the wafer 200 is desorbed and/or nullified. That is, by performing this step, the film subjected to the heat treatment is present on the second surface, and at least a portion of the first surface is exposed. FIG. 5E shows an example in which the inhibitor layer formed on the first surface is desorbed and removed to expose the first surface.

This step may be performed while an inert gas is supplied into the process chamber 201, or may be performed while a reactive substance such as an oxidizing agent (oxidizing gas) is supplied into the process chamber 201. The reactive substance such as an inert gas or an oxidizing agent (oxidizing gas) used in this case is also referred to assisting substance.

Processing conditions when performing the heat treatment in the heat treatment step are exemplified as follows.
Processing temperature: 200 to 1000 degrees C., specifically 400 to 700 degrees C.
Processing pressure: 1 to 120000 Pa
Processing time: 1 to 18000 seconds
Assist substance supply flow rate: 0 to 50 slm
(After-Purge and Returning to Atmospheric Pressure)

After the heat treatment step is completed, an inert gas as a purge gas is supplied into the process chamber 201 from each of the nozzles 249a to 249c and exhausted via the exhaust port 231a. As a result, the inside of the process chamber 201 is purged such that gases, reaction by-products, and the like remaining in the process chamber 201 are removed from the inside of the process chamber 201 (after-purge). Thereafter, the atmosphere in the process chamber 201 is replaced with an inert gas (inert gas replacement), and the pressure in the process chamber 201 is returned to the atmospheric pressure (returning to atmospheric pressure).
(Boat Unloading and Wafer Discharging)

Thereafter, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter 219s is moved and the lower end opening of the manifold 209 is sealed by the shutter 219s via the O-ring 220c (shutter closing). The processed wafers 200 are discharged out of the boat 217 after being unloaded to the outside of the reaction tube 203 (wafer discharging).

The cleaning step, the modifying step, the film-forming step, and the heat treatment step may be performed in the same process chamber (in-situ). As a result, after the surface of the wafer 200 is cleaned by the cleaning step (after the native oxide film is removed), the modifying step, the film-forming step, and the heat treatment step may be performed without exposing the wafer 200 to the ambient air, that is, while keeping the surface of the wafer 200 clean. This makes it possible to properly perform selective growth. That is, by performing these steps in the same process chamber, selective growth may be performed with high selectivity. Further, when the cleaning step may not be performed as described above, the modifying step, the film-forming step, and the heat treatment step may be performed in the same process chamber. Further, when the heat treatment step may be omitted as described above, the modifying step and the film-forming step may be performed in the same process chamber.

(3) Effects of the Embodiments of the Present Disclosure

According to the embodiments of the present disclosure, one or more selected from the group of the following effects may be obtained.

By satisfying WP>DA−WI when WI is smaller than DA and satisfying WP>DAx−WI (where x is the smallest integer that satisfies WI<DAx) when WI is larger than DA, in the film-forming step, the inhibitor molecules effectively act as a steric hindrance to the molecules X (precursor molecules) that constitute the precursor as the predetermined substance contained in the film-forming agent. This makes it possible to prevent the molecules X (precursor molecules) from passing through the gaps between the inhibitor molecules and reaching the first surface. Thus, it is possible to suppress the precursor as the predetermined substance contained in the film-forming agent contacting the first surface, and therefore it is possible to suppress the adsorption (chemisorption or physisorption) of the precursor on the first surface. As a result, it is possible to suppress an occurrence of selection failure. Further, by suppressing the precursor from contacting the first surface, even when a highly-reactive substance is used as the precursor, it is possible to suppress the reaction between the precursor and the first surface, thereby suppressing the resultant desorption of the inhibitor molecules and the consequent selection failure. This makes it possible to selectively form a film on a desired surface with high accuracy.

By selecting the type of at least one selected from the group of the modifying agent and the precursor to satisfy the above-described relational expressions, it is possible to achieve the above effects. Further, by regulating the state of the adsorption sites (spacing, density, and the like of the adsorption sites) on the first surface to satisfy the above-described relational expressions, it is possible to achieve the above-described effects. Further, in some embodiments, the state of the adsorption sites (spacing, density, and the like of the adsorption sites) on the first surface may be regulated to select the type of at least one selected from the group of the modifying agent and the precursor to satisfy the above-described relational expressions. Further, in some embodiments, the state of the adsorption sites (spacing, density, and the like of the adsorption sites) on the first surface may be regulated to select the types of the modifying agent and the precursor to satisfy the above-described relational expressions.

In a case where WP≤DA−WI is satisfied when WI is smaller than DA, in the film-forming step, the action of the inhibitor molecules as the steric hindrance to the molecules X (precursor molecules) is deteriorated and the precursor is highly likely to contact the first surface. As a result, the blocking effect described above is insufficient. Further, in a case where WP DAx-WI is satisfied when WI is larger than DA, in the film-forming step, the action of the inhibitor molecules as the steric hindrance to the molecules X (precursor molecules) is deteriorated and the precursor is highly likely to contact the first surface. As a result, the blocking effect described above is insufficient.

In the film-forming step, a cycle including alternately performing the precursor supply step and the reactant supply step is performed a predetermined number of times, and the catalyst is supplied to the wafer 200 in at least one selected from the group of the precursor supply step and the reactant supply step, whereby it becomes possible to perform selective growth with good controllability under the above-described low-temperature conditions.

The above-mentioned effects may be similarly obtained by arbitrarily selecting and using predetermined substances (gaseous substances or liquid substances) from the above-described various cleaning agents, various modifying agents, various precursors, various reactants, various catalysts, and various inert gases.

(4) Modifications

The substrate processing sequences according to the embodiments of the present disclosure may be modified as in modifications described below. These modifications may be combined arbitrarily. Unless specified otherwise, processing procedures and processing conditions in each step of each modification may be the same as the processing procedures and processing conditions in each step of the substrate processing sequence described above.

First Modification

Figure 11:
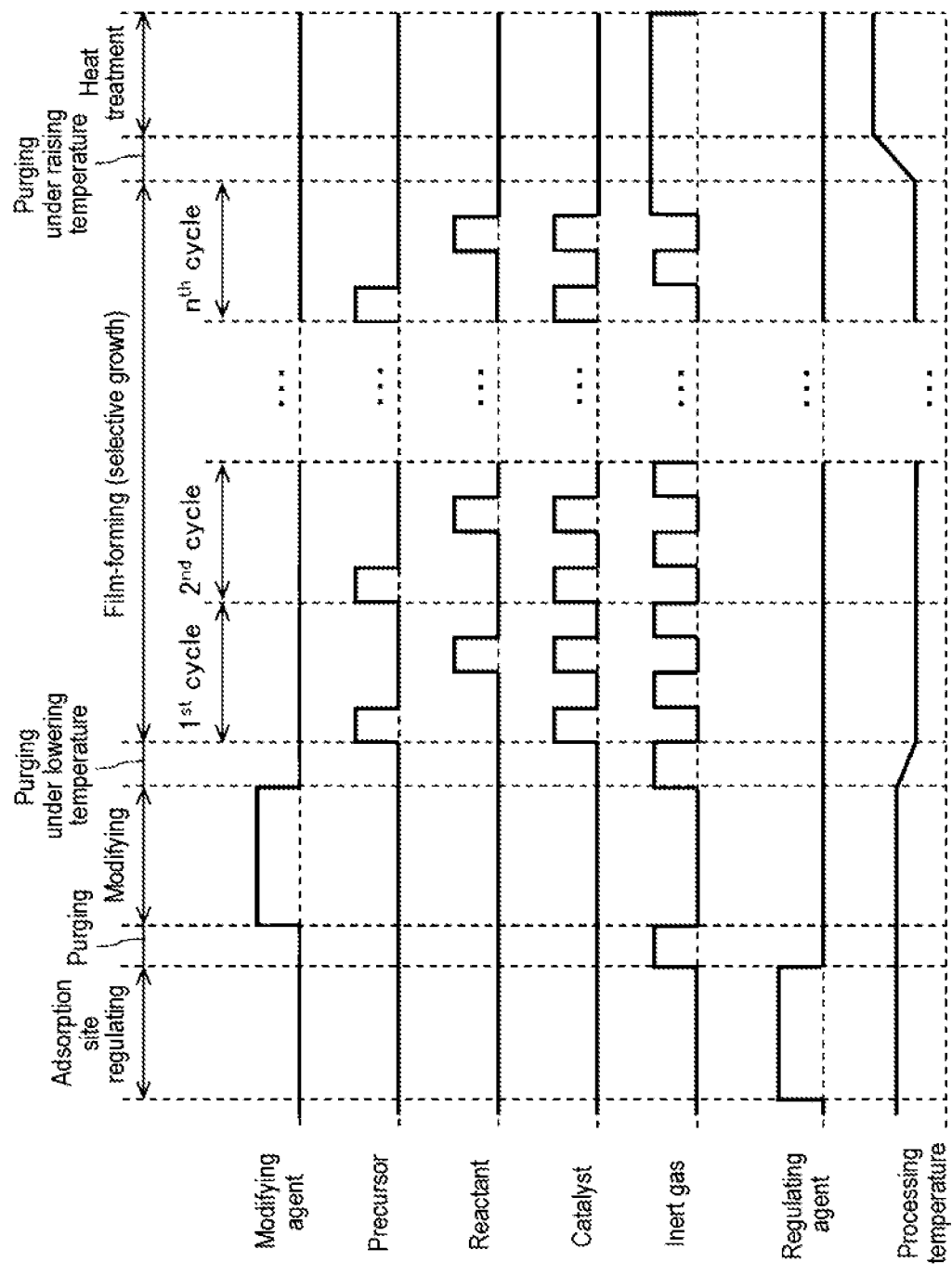
FIG. 11 is a diagram illustrating a processing sequence according to a first modification of the present disclosure.

As in the processing sequences shown in FIG. 11 and described below, a step of regulating at least one selected from the group of spacing and density of the adsorption sites on the first surface of the wafer 200 (adsorption site regulating step) may be performed by supplying a regulating agent to the wafer 200 before performing the modifying step, that is, before performing the step of forming the inhibitor layer.

Regulating agent→modifying agent→(precursor+ catalyst→reactant)×n→heat treatment Regulating agent→modifying agent→(precursor→reactant+catalyst)×n→heat treatment Regulating agent→modifying agent→(precursor+ catalyst→reactant+catalyst)×n→heat treatment In this case, as in the processing sequences described below, a cleaning step may be further performed before the adsorption site regulating step. In this case, a state of focusing on the regulation of the adsorption sites on the first surface may be suppressed in the cleaning step to separately perform the adsorption site regulating step after the cleaning step. Therefore, the cleaning step may be performed under the processing conditions more specialized for the cleaning process. As a result, the cleaning process, and the regulation of the adsorption sites on the first surface may be performed with better controllability.

Cleaning agent→regulating agent→modifying agent→(precursor+catalyst→reactant)×n→heat treatment Cleaning agent→regulating agent→modifying agent→(precursor→reactant+catalyst)×n→heat treatment Cleaning agent→regulating agent→modifying agent→(precursor+catalyst→reactant+catalyst)× n→heat treatment In the adsorption site regulating step, the regulating agent may be supplied to the wafer 200 from a regulating agent supply system. At least one selected from the group of the spacing and the density of the adsorption sites on the first surface of wafer 200 may be regulated by supplying the regulating agent to the wafer 200 under the processing conditions described below. For example, the spacing (density) of the adsorption sites on the first surface may be relatively sparse as shown in FIG. 7, or may be relatively dense as shown in FIG. 8. Thereafter, a modifying step, a film-forming step, and a heat treatment step may be performed in the same manner as in the above-described embodiments of the present disclosure. Further, as in the above-described embodiments of the present disclosure, when removal of impurities, repair of defects, hardening of the film, or the like may not be performed on the film formed on the second surface in the film-forming step, the heat treatment step may not be performed.

Processing conditions when supplying the regulating agent in the adsorption site regulating step am exemplified as follows.

Processing temperature: 100 to 400 degrees C., specifically 200 to 350 degrees C.

Processing pressure: 1 to 101325 Pa, specifically 1 to 13300 Pa

Processing time: 1 to 240 minutes, specifically 30 to 120 minutes

Regulating agent supply flow rate: 0 to 20 slm

Inert gas supply flow rate (for each gas supply pipe): 1 to 20 slm, specifically 2 to 10 slm.

At least one selected from the group of the spacing and the density of the adsorption sites on the first surface may be regulated by the heat treatment (annealing process) without supplying the regulating agent. The above-mentioned regulating agent supply flow rate of 0 slm indicates that case. When regulating the adsorption sites on the first surface by an annealing process, an inert gas may be supplied, and the inert gas supplied in this case may also be referred to as regulating agent. When regulating the adsorption sites on the first surface by the annealing process, for example, the adsorption sites may be regulated such that as the processing temperature increases, the processing pressure increases, or the processing time increases, the spacing (density) of the adsorption sites on the first surface becomes sparser. Further, in this case, for example, the adsorption sites may be regulated such that as the processing temperature decreases, the processing pressure decreases, or the processing time decreases, the spacing (density) of the adsorption sites on the first surface becomes denser. Thus, the spacing (density) of the adsorption sites on the first surface may be regulated by the annealing process with good controllability.

As the regulating agent, for example, at least one selected from the group of the above-described various inert gases, various cleaning agents, and various oxidizing agents may be used. The regulating agent may be gaseous substance or liquid substance. Further, the regulating agent may be liquid substance such as mist substance. One or more selected from the group of these substances may be used as the regulating agent.

When an O- and H-containing substance, which is an oxidizing agent, or an O- and H-containing substance such as various aqueous solutions is used as the regulating agent, the density of OH terminations (OH groups) on the first surface may be increased, and the spacing (density) of the adsorption sites on the first surface may be regulated to be dense. That is, the spacing (density) of the adsorption sites on the first surface may be regulated to be dense by an oxidizing process. As described below, even when a H-containing gas (H-containing substance), which is a reducing agent, is used as the regulating agent, the density of OH terminations on the first surface may be increased, and the spacing (density) of the adsorption sites on the first surface may be regulated to be dense. That is, the spacing (density) of the adsorption sites on the first surface may be regulated to be dense by a reducing process.

On the other hand, when O- and H-free substance or H-free substance is used as the regulating agent, the density of OH terminations (OH groups) on the first surface may be deteriorated, and the spacing (density) of the adsorption sites may be regulated to be sparse. Thus, the spacing (density) of the adsorption sites on the first surface may be regulated with good controllability by exposing the first surface to O- and H-containing substance or H-containing substance, or by exposing the first surface to O- and H-free substance or H-free substance.

Further, by sequentially or alternately performing the process that uses the O- and H-containing substance or the H-containing substance as the regulating agent and the process that uses the O- and H-free substance or the H-free substance as the regulating agent, each of the above-described control operations may be finely regulated. In this case, by controlling the respective processing conditions, balance of states of regulations in the respective processes may be controlled, and one of these regulations may be made dominant. This makes it possible to regulate the spacing (density) of the adsorption sites on the first surface with better controllability. For example, by sequentially or alternately performing the process using the O- and H-containing substance as the regulating agent and the annealing process, the spacing (density) of adsorption sites on the first surface may be regulated with better controllability.

Further, when a cleaning agent is used as the regulating agent, it is possible to regulate the spacing (density) of the adsorption sites on the first surface in parallel with the removal of the native oxide film formed on the second surface. That is, the removal of the native oxide film on the second surface and the regulation of the spacing (density) of the adsorption sites on the first surface may be performed in parallel, that is, simultaneously and in parallel. Further, the removal of the native oxide film formed on the second surface by the cleaning agent corresponds to an etching process. In this operation, a portion of the first surface may be etched. That is, the cleaning process is also an etching process. By this etching process, the spacing (density) of the adsorption sites on the first surface may be regulated to be sparse. On the other hand, when the cleaning agent contains O- and H-containing substance such as an aqueous solution or a cleaning liquid, the spacing (density) of the adsorption sites on the first surface may be regulated to be dense. By controlling the processing conditions in the cleaning process, it is possible to control the balance of these regulations such that one of these regulations may be predominant. This makes it possible to regulate the spacing (density) of the adsorption sites on the first surface with good controllability.

Further, a reducing agent (H-containing substance) may be used as the regulating agent. That is, the spacing (density) of the adsorption sites on the first surface may be regulated by a reducing process. As the reducing agent, for example, a $H_2$ gas or a $D_2$ gas may be used. By using the reducing agent as the regulating agent, the density of OH terminations on the first surface may be increased, and the spacing (density) of adsorption sites on the first surface may be regulated to be dense.

Further, as the regulating agent, the various regulating agents described above may be plasma-excited and used. That is, the spacing (density) of the adsorption sites on the first surface may be regulated by a plasma treatment. In this case, various active species generated by plasma-exciting the various regulating agents described above are supplied to the first surface. For example, when O- and H-containing substance or H-containing substance is plasma-excited and used as the regulating agent, the density of OH terminations on the first surface may be increased, and the spacing (density) of adsorption sites on the first surface may be regulated to be dense. On the other hand, when O- and H-free substance or H-free substance is plasma-excited and used as the regulating agent, the density of OH terminations on the first surface may be deteriorated, and the spacing (density) of adsorption sites may be regulated to be sparse. Even when the above-mentioned various regulating agents are plasma-excited and used in this way, the spacing (density) of the adsorption sites on the first surface may be regulated with good controllability.

As described above, the spacing (density) of the adsorption sites on the first surface may be regulated with good controllability by at least one selected from the group of the heat treatment, the cleaning process, the etching process, the reducing process, the oxidizing process, the exposure of the O- and H-containing substance to the first surface, and the plasma treatment. By using at least two or more selected from the group of these various treatments and processes in combination, it is possible to finely regulate the various controls described above and to regulate the spacing (density) of the adsorption sites on the first surface with better controllability.

Also in this modification, the same effects as in the above-described embodiments of the present disclosure may be obtained. Further, according to this modification, by regulating the spacing (density) of the adsorption sites on the first surface in the adsorption site regulating step, the gap between the inhibitor molecules adsorbed on the first surface in the modifying step may be freely regulated. This makes it possible to increase a degree of freedom in combining the type of modifying agent used in the modifying step and the type of precursor used in the film-forming step. That is, it is possible to increase the degree of freedom in the type of modifying agent used in the modifying step and the degree of freedom in the type of precursor used in the film-forming step.

Second Modification

In the case where the wafer 200 is processed according to the processing sequence of the first modification, when DA is regulated to be larger than WI in the adsorption site regulating step, WP>DA−WI may be satisfied. In this case, for example, the spacing (density) of the adsorption sites on the first surface is regulated to satisfy DA>WI and WP>DA−WI. Further, for example, the spacing (density) of the adsorption sites on the first surface is regulated and the type of modifying agent is selected to satisfy DA>WI and WP>DA−WI. Further, for example, the spacing (density) of the adsorption sites on the first surface is regulated and the type of precursor is selected to satisfy DA>WI and WP>DA−WI. Further, for example, the spacing (density) of the adsorption sites on the first surface is regulated and the types of modifying agent and precursor are selected to satisfy DA>WI and WP>DA−WI.

By doing so, as shown in FIG. 9, the inhibitor molecules effectively act as a steric hindrance to the molecules X (precursor molecules). This makes it possible to sufficiently hinder the molecules X (precursor molecules) from passing through the gaps between the inhibitor molecules and reaching the first surface. In this case, the effects in the first modification may be obtained more sufficiently. Also in this case, it is possible to increase the degree of freedom in combining the type of modifying agent and the type of precursor.

Third Modification

In the case where the wafer 200 is processed according to the processing sequence of the first modification, when DA is regulated to be smaller than WI in the adsorption site regulating step, WP>DAx−WI (where x is the minimum integer satisfying WI<DAx) may be satisfied. In this case, for example, the spacing (density) of the adsorption sites on the first surface is regulated to satisfy DA<WI and WP>DAx−WI. Further, for example, the spacing (density) of the adsorption sites on the first surface is regulated and the type of modifying agent is selected to satisfy DA<WI and WP>DAx−WI. Further, for example, the spacing (density) of the adsorption sites on the first surface is regulated and the type of precursor is selected to satisfy DA<WI and WP>DAx−WI. Further, for example, the spacing (density) of the adsorption sites on the first surface is regulated and the types of modifying agent and precursor are selected to satisfy DA<WI and WP>DAx−WI.

By doing so, as shown in FIG. 10, the inhibitor molecules effectively act as a steric hindrance to the molecules X (precursor molecules). This makes it possible to sufficiently hinder the molecules X (precursor molecules) from passing through the gaps between the inhibitor molecules and reaching the first surface. In this case, the effects of the first modification may be obtained more sufficiently. Further, in this case, it is possible to increase the degree of freedom in combining the type of modifying agent and the type of precursor.

Fourth Modification

As in the processing sequences denoted below, the film-forming step may not use the catalyst. The catalyst may not be used, and the catalyst may not be supplied depending on the processing conditions. Further, in this modification, the same effects as in the above-described embodiments of the present disclosure may be obtained. Further, according to this modification, it is possible to reduce the amount of substances used in the film-forming step and to reduce a gas cost. Further, the processing sequence may be simplified, and the structures of the control system and the gas supply system may be simplified.

Modifying agent→(precursor→reactant)×n

Cleaning agent→modifying agent→(precursor→reactant)×n

Regulating agent→modifying agent→(precursor→reactant)×n

Cleaning agent→regulating agent→modifying agent→(precursor→reactant)×n

Modifying agent→(precursor→reactant)×n→heat treatment

Cleaning agent→modifying agent→(precursor→reactant)×n→heat treatment

Regulating agent→modifying agent→(precursor→reactant)×n→heat treatment

Cleaning agent→regulating agent→modifying agent→(precursor→reactant)×n→heat treatment Fifth Modification As in the processing sequences described below, when the above-described cycle is performed a predetermined number of times, the modifying step may be performed each cycle. Further, in this modification, the same effects as in the above-described embodiments and modifications may be obtained. Further, according to this modification, by performing the modifying step in each cycle, it is possible to further enhance the film formation inhibition effect (adsorption inhibition effect or reaction inhibition effect) of the inhibitor layer.

(Modifying agent→precursor→reactant)×n

Cleaning agent→(modifying agent→precursor→reactant)×n

Regulating agent→(modifying agent→precursor→reactant)×n

Cleaning agent→regulating agent→(modifying agent→precursor→reactant)×n (Modifying agent→precursor→reactant)×n→heat treatment Cleaning agent→(modifying agent→precursor→reactant)×n→heat treatment Regulating agent→(modifying agent→precursor→reactant)×n→heat treatment Cleaning agent→regulating agent→(modifying agent→precursor→reactant)×n→heat treatment Modification 6

As in the processing sequences described below, in the reactant supply step, a reactant performing a function of the regulating agent may be used as the reactant, or the regulating agent may be additionally supplied. Further, in this modification, the same effects as in the above-described embodiments and the fifth modification may be obtained. Further, according to this modification, it is possible to perform the adsorption site regulating step in each cycle. In each cycle, the above-described relational expressions may be satisfied with high accuracy, and the film formation inhibition effect (adsorption inhibition effect or reaction inhibition effect) by the inhibitor layer may be further enhanced. Further, according to this modification, the reactant supply step and the adsorption site regulating step may be performed in parallel, that is, simultaneously and in parallel. Thus, in the second cycle or the second and at least one subsequent cycles, the adsorption site regulating step may not be performed separately. As a result, it is possible to shorten the processing time and to improve a throughput of substrate processing, that is, a productivity of substrate processing. Further, although the processing sequences based on the fifth modification are exemplified below, this modification may be applied to the various processing sequences of the above-described embodiments and modifications.

(Modifying agent→precursor→reactant (regulating agent))×n

Cleaning agent→(modifying agent→precursor→reactant (regulating agent))×n

Regulating agent→(modifying agent→precursor→reactant (regulating agent))×n

Cleaning agent→regulating agent→(modifying agent→precursor→reactant (regulating agent))×n (Modifying agent→precursor→reactant (regulating agent))×n→heat treatment Cleaning agent→(modifying agent→precursor→reactant (regulating agent))×n→heat treatment Regulating agent→(modifying agent→precursor→reactant (regulating agent))×n→heat treatment Cleaning agent→regulating agent→(modifying agent→precursor→reactant (regulating agent))×n→heat treatment (Modifying agent→precursor→reactant+regulating agent)×n Cleaning agent→(modifying agent→precursor→reactant+regulating agent)×n Regulating agent→(modifying agent→precursor→reactant+regulating agent)×n Cleaning agent→regulating agent→(modifying agent→precursor→reactant+regulating agent)×n (Modifying agent→precursor→reactant+regulating agent)×n→heat treatment Cleaning agent→(modifying agent→precursor→reactant+regulating agent)×n→heat treatment Regulating agent→(modifying agent→precursor→reactant+regulating agent)×n→heat treatment Cleaning agent→regulating agent→(modifying agent→precursor→reactant+regulating agent)×n→heat treatment

Seventh Modification

The predetermined substance contained in the film-forming agent may be a reactant. That is, the molecules X may be reactant molecules. When the molecules X are the reactant molecules, the inhibitor molecules effectively act as a steric hindrance to the molecules X (reactant molecules) by satisfying the above relational expressions. This makes it possible to suppress the molecules X (reactant molecules) from passing through the gaps between the inhibitor molecules and reaching the first surface. As a result, it is possible to suppress the reactant, which is the predetermined substance contained in the film-forming agent, from contacting the first surface, thereby suppressing the reaction of the reactant on the first surface. This makes it possible to obtain effects similar to those described above.

Further, in this case, even when a precursor with a small molecular size is used and this precursor passes through the gaps between the inhibitor molecules and reaches the first surface, it is possible to suppress the reactant from contacting the first surface, thereby suppressing the reaction by the reactant on the first surface. Further, in this case, even when a catalyst with a small molecular size is used and this catalyst passes through the gaps between the inhibitor molecules and reaches the first surface, it is possible to suppress the reactant from contacting the first surface, thereby suppressing the reaction by the reactant on the first surface. As a result, it is possible to suppress an occurrence of selection failure. Further, since it is possible to suppress the reactant from contacting the first surface, even when a highly-reactive substance is used as the reactant, it is possible to suppress the reaction between the reactant and the first surface, thereby suppressing the resultant desorption of the inhibitor molecules and the consequent selection failure.

Eighth Modification

The predetermined substance contained in the film-forming agent may be a catalyst. That is, the molecules X may be catalyst molecules. When the molecules X are the catalyst molecules, by satisfying the above-described relational expressions, the inhibitor molecules effectively act as a steric hindrance to the molecules X (catalyst molecules). This makes it possible to prevent the molecules X (catalyst molecules) from passing through the gaps between the inhibitor molecules and reaching the first surface. As a result, it is possible to suppress the catalyst, which is a predetermined substance contained in the film-forming agent, from contacting the first surface, thereby suppressing the catalytic reaction by the catalyst on the first surface. This makes it possible to obtain effects similar to those described above.

Further, in this case, even when a precursor with a small molecular size is used and this precursor passes through the gaps between the inhibitor molecules and reaches the first surface, it is possible to suppress the catalyst from contacting the first surface, thereby suppressing the catalytic reaction of the catalyst on the first surface. Further, in this case, even when a reactant with a small molecular size is used and this reactant passes through the gaps between the inhibitor molecules and reaches the first surface, it is possible to suppress the catalyst from contacting the first surface, thereby suppressing the reaction of the catalyst on the first surface. As a result, it is possible to suppress an occurrence of selection failure. Further, since it is possible to suppress the catalyst from contacting the first surface, even when a highly-reactive substance is used as the catalyst, it is possible to suppress the reaction between the catalyst and the first surface, thereby suppressing the resultant desorption of the inhibitor molecules and the consequent selection failure.

Ninth Modification

The predetermined substance contained in the film-forming agent may include at least one selected from the group of a precursor and a reactant. For example, the predetermined substance may include a precursor as in the above-described embodiments of the present disclosure, may include a reactant as in the seventh modification, or may include a precursor and a reactant. When the predetermined substance includes the precursor and the reactant, it is possible to further enhance the above-described blocking effect.

Tenth Modification

The predetermined substance contained in the film-forming agent may include at least one selected from the group of a precursor, a reactant, and a catalyst. For example, the predetermined substance may include a precursor as in the above-described embodiments of the present disclosure, a reactant as in the seventh modification, or a catalyst as in the eighth modification. Further, for example, the predetermined substance may include a precursor and a reactant as in the ninth modification, may include a precursor and a catalyst, may include a reactant and a catalyst, and may include a precursor, a reactant, and a catalyst. In these cases, the blocking effect described above may be further enhanced. Further, when the predetermined substance includes the precursor, the reactant, and the catalyst, the precursor, the reactant, and the catalyst are less likely to contact the first surface, and the above-described blocking effect is maximized.

Eleventh Modification

The inhibitor molecules may contain at least one selected from the group of a hydrocarbon group, a fluorocarbon group, and a fluorosilyl group. That is, the inhibitor layer formed on the first surface may contain at least one selected from the group of a hydrocarbon termination, a fluorocarbon termination, and a fluorosilyl termination. The case where the inhibitor molecule contains the hydrocarbon group is the same as the case in the above-described embodiments of the present disclosure.

When the inhibitor molecule contains a fluorocarbon group, for example, the gas containing the amino group or the gas containing the amino group and the alkyl group and the F-containing gas described above may be used as the modifying agent, and these gases may be supplied to the wafer 200 sequentially or simultaneously. Further, when the inhibitor molecule contains the fluorocarbon group, for example, one of the gases containing the amino group and the alkyl group described above, in which a portion of or the entirety of the C—H bonds of the alkyl group are replaced with F, may be used as the modifying agent. Due to at least one selected from the group of these gases, the inhibitor layer formed on the first surface contains fluorocarbon terminations.

Further, when the inhibitor molecule contains a fluorosilyl group, for example, the gas containing the amino group such as the aminosilane-based gas and the F-containing gas described above may be used as the modifying agent, and these gases may be supplied to the wafer 200 sequentially or simultaneously. As a result, the inhibitor layer formed on the first surface contains fluorosilyl terminations.

In any case, the outermost surface of the inhibitor layer is formed of F. Therefore, these may also be referred to as F terminations. The fluorocarbon group or fluorosilyl group terminating the first surface may prevent adsorption of the precursor (film-forming agent) on the first surface in the film-forming step, and may inhibit (suppress) the progress of the film-forming reaction on the first surface. Further, in this modification, the same effects as in the above-described embodiments of the present disclosure may be obtained.

Other Embodiments of the Present Disclosure

The embodiments of the present disclosure are specifically described above. However, the present disclosure is not limited to the above-described embodiments, and various changes may be made without departing from the gist thereof.

For example, the wafer 200 may include at least one selected from the group of an oxygen-containing film and a metal-containing film as the first surface (first base), and may include at least one selected from the group of an oxygen-free film and a metal-free film as the second surface (second base). Further, for example, the wafer 200 may include a plurality of types of regions made of different materials as the first surface (first base), and may include a plurality of types of regions made of different materials as the second surface (second base). As the regions (bases) constituting the first surface and the second surface, in addition to the above-described SiO film and SiN film, it may be possible to use: a semiconductor element-containing film such as a silicon oxycarbonitride film (SiOCN film), a silicon oxycarbide film (SiOC film), a silicon oxynitride film (SiON film), a silicon carbonitride film (SiCN film), a silicon carbide film (SiC film), a silicon borocarbonitride film (SiBCN film), a silicon boronitride film (SiBN film), a silicon borocarbide film (SiBC film), a silicon film (Si film), a germanium film (Ge film), a silicon germanium film (SiGe film), or the like; a metal element-containing film such as a titanium nitride film (TiN film), a tungsten film (W film), a molybdenum film (Mo film), a ruthenium film (Ru film), a cobalt film (Co film), a nickel film (Ni film), a copper film (Cu film), or the like; an amorphous carbon film (a-C film); and a monocrystalline Si (Si wafer). Any region (base) may be used as the first surface as long as an inhibitor layer may be formed on the region (base). On the other hand, any region (base) may be used as the second surface in a case where it is difficult to form the inhibitor layer on the region (base). Further, the same effects as in the above-described embodiments of the present disclosure may be obtained.

Further, for example, in the selective growth, in addition to the SiOC film and the SiO film, it may be possible to form, for example, a semiconductor element-containing film such as a SiON film, a SiOCN film, a SiCN film, a SiC film, a SiN film, a SiBCN film, a SiBN film, a SiBC film, a Si film, a Ge film, a SiGe film, or the like, and a metal element-containing film such as a TiN film, a W film, a WN film, a Mo film, a Ru film, a Co film, a Ni film, an Al film, an AlN film, a Tio film, a WO film, a WON film, a MoO film, a RuO film, a CoO film, a NiO film, an AlO film, a ZrO film, a HfO film, a TaO film, or the like. Even when these films are formed, the same effects as in the above-described embodiments of the present disclosure may be obtained.

The recipe used for each process may be provided separately according to the processing contents and may be stored in the memory 121c via an electric communication line or an external memory 123. When starting each process, the CPU 121a may properly selects an appropriate recipe from a plurality of recipes stored in the memory 121c according to the contents of the process. This makes it possible to form films of various film types, composition ratios, film qualities and film thicknesses with high reproducibility in one substrate processing apparatus. Further, a burden on an operator may be reduced, and each process may be quickly started while avoiding operation errors.

The above-described recipes are not limited to the newly provided ones, but may be provided by, for example, changing the existing recipes already installed in the substrate processing apparatus. In the case of changing the recipes, the changed recipes may be installed in the substrate processing apparatus via an electric communication line or a recording medium in which the recipes are recorded. Further, the input/output apparatus 122 included in the existing substrate processing apparatus may be operated to directly change the existing recipes already installed in the substrate processing apparatus.

In the above-described embodiments of the present disclosure, the film is formed by using a batch-type substrate processing apparatus configured to process a plurality of substrates at a time. The present disclosure is not limited to the above-described embodiments of the present disclosure, but may be suitably applied to, for example, a case where a film is formed by using a single-wafer-type substrate processing apparatus configured to process one or several substrates at a time. Further, in the above-described embodiments of the present disclosure, the film is formed by using a substrate processing apparatus including a hot-wall-type process furnace. The present disclosure is not limited to the above-described embodiments of the present disclosure but may also be suitably applied to a case where a film is formed by using a substrate processing apparatus including a cold-wall-type process furnace.

Even when these substrate processing apparatuses are used, the respective processes may be performed under the same processing procedures and processing conditions as those of the above-described embodiments and modifications. Effects similar to those of the above-described embodiments and modifications may be obtained.

The above-described embodiments and modifications may be used in combination as appropriate. In this case, the processing procedures and processing conditions may be, for example, the same as the processing procedures and processing conditions of the above-described embodiments and modifications.

EXAMPLES

First Example

A wafer including a first surface and a second surface in the same manner as the above-described embodiments of the present disclosure is subjected to the processing sequence of the first modification described above to form a SiOC film on the second surface, thereby providing an evaluation sample 1 of the first Example. When providing the evaluation sample 1, the adsorption sites (OH groups) are regulated by an annealing process to satisfy DA>WI and WP>DA−WI. Further, WP is defined as a width of a precursor molecule constituting a precursor as a predetermined substance contained in a film-forming agent. The processing conditions in each step when providing the evaluation sample 1 are set to predetermined conditions within a range of the processing conditions in each step described above. Further, the annealing process by which the adsorption sites are regulated is performed at a processing temperature of 300 to 350 degrees C.

Second Example

A wafer including a first surface and a second surface in the same manner as the above-described embodiments of the present disclosure is subjected to a processing sequence of the first modification described above to form a SIOC film on the second surface, thereby providing an evaluation sample 2 of the second Example. When providing the evaluation sample 2, the adsorption sites (OH groups) are regulated by an annealing process to satisfy DA<WI and WP>DAx−WI (where x is the smallest integer that satisfies WI<DAx). Further, WP is defined as a width of a precursor molecule constituting a precursor as a predetermined substance contained in a film-forming agent. The processing conditions in each step when providing the evaluation sample 2 are the same as the processing conditions in each step of the first Example, except for the processing conditions in the annealing process by which the adsorption sites are regulated. Further, the annealing process by which the adsorption sites are regulated is performed at a processing temperature of 100 to 200 degrees C.

First Comparative Example

A wafer including a first surface and a second surface in the same manner as the above-described embodiments of the present disclosure is subjected to a processing sequence similar to that of the first modification described above to form a SiOC film on the second surface, thereby providing an evaluation sample 3 of the first Comparative Example. When providing the evaluation sample 3, the adsorption sites (OH groups) are regulated by an annealing process to satisfy DA>WI and WP≤DA−WI. Further, WP is defined as a width of a precursor molecule constituting a precursor as a predetermined substance contained in a film-forming agent. The processing conditions in each step when providing the evaluation sample 3 are the same as the processing conditions in each step of the first Example, except for the processing conditions in the annealing process by which the adsorption sites are regulated. Further, the annealing process by which the adsorption sites are regulated is performed at a processing temperature of 500 to 600 degrees C.

After providing the respective evaluation samples, a difference between a thickness of the SiOC film formed on the second surface and a thickness of the SiOC film formed on the first surface in each evaluation sample (hereinafter referred to as a film thickness difference) is measured. That is, the difference obtained by subtracting the thickness of the SiOC film formed on the first surface from the thickness of the SiOC film formed on the second surface in each evaluation sample is measured.

As a result, it is confirmed that the film thickness difference in each of the evaluation samples 1 and 2 is much larger than the film thickness difference in the evaluation sample 3, and therefore a selectivity in the evaluation samples 1 and 2 of the first and second Examples is much higher than that of the evaluation sample 3 of the first Comparative Example.

According to the embodiments of the present disclosure, it is possible to selectively form a film on a desired surface with high accuracy.

While certain embodiments are described above, these embodiments are presented byway of example, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would tall within the scope and spirit of the disclosures.

What is claimed is:

1. A method of processing a substrate, comprising:
   (A) supplying a modifying agent to a substrate including a first surface and a second surface to form an inhibitor layer on the first surface;
   (B) supplying a film-forming agent to the substrate after forming the inhibitor layer on the first surface to form a film on the second surface; and
   (C) regulating a density of adsorption sites on the first surface before performing (A),
   wherein a width of an inhibitor molecule constituting the inhibitor layer is defined as WI, a spacing between adjacent adsorption sites on the first surface is defined as DA, a width of a molecule X constituting a predetermined substance contained in the film-forming agent is defined as WP,
   wherein WP>DA−WI is satisfied when WI is smaller than DA, and
   wherein WP>DAx−WI is satisfied when WI is larger than DA, where x is a smallest integer that satisfies WI<DAx.

2. The method of claim 1, wherein a type of the modifying agent is selected to satisfy DA>WI and WP>DA−WI or to satisfy DA<WI and WP>DAx−WI.

3. The method of claim 1, wherein a type of the predetermined substance is selected to satisfy DA>WI and WP>DA−WI or to satisfy DA<WI and WP>DAx−WI.

4. The method of claim 1, wherein in (C), DA is regulated by regulating the density of the adsorption sites on the first surface.

5. The method of claim 1, wherein in (C), the density of the adsorption sites on the first surface is regulated to satisfy DA>WI and WP>DA−WI or to satisfy DA<WI and WP>DAx−WI.

6. The method of claim 1, wherein in (C), the density of the adsorption sites on the first surface is regulated by a heat treatment.

7. The method of claim 1, wherein in (C), the density of the adsorption sites on the first surface is regulated by a cleaning process.

8. The method of claim 1, wherein in (C), the density of the adsorption sites on the first surface is regulated by an etching process.

9. The method of claim 1, wherein in (C), the density of the adsorption sites on the first surface is regulated by a reducing process.

10. The method of claim 1, wherein in (C), the density of the adsorption sites on the first surface is regulated by an oxidizing process.

11. The method of claim 1, wherein in (C), the density of the adsorption sites on the first surface is regulated by a plasma treatment.

12. The method of claim 1, wherein in (C), the density of the adsorption sites on the first surface is regulated by exposing the substrate to an oxygen- and hydrogen-containing substance.

13. The method of claim 1, wherein the adsorption sites on the first surface include OH groups.

14. The method of claim 1, wherein the first surface includes at least one selected from the group of an oxygen-containing film and a metal-containing film, and the second surface includes at least one selected from the group of an oxygen-free film and a metal-free film.

15. The method of claim 1, wherein the inhibitor molecule includes at least one selected from the group of a hydrocarbon group, a fluorocarbon group, and a fluorosilyl group.

16. The method of claim 1, wherein the film-forming agent includes a precursor and a reactant, and the predetermined substance includes at least one selected from the group of the precursor and the reactant.

17. The method of claim 16, wherein in (B), a cycle including (B1) supplying the precursor to the substrate and (B2) supplying the reactant to the substrate is performed a predetermined number of times.

18. The method of claim 1, wherein the film-forming agent includes a precursor, a reactant, and a catalyst, and the predetermined substance includes at least one selected from the group of the precursor, the reactant, and the catalyst.

19. The method of claim 18, wherein in (B), a cycle including (B1) supplying the precursor to the substrate and (B2) supplying the reactant to the substrate is performed a predetermined number of times, and the catalyst is supplied to the substrate in at least one selected from the group of (B1) and (B2).

20. A method of manufacturing a semiconductor device, comprising:
   (A) supplying a modifying agent to a substrate including a first surface and a second surface to form an inhibitor layer on the first surface;
   (B) supplying a film-forming agent to the substrate after forming the inhibitor layer on the first surface to form a film on the second surface; and
   (C) regulating a density of adsorption sites on the first surface before performing (A),
   wherein a width of an inhibitor molecule constituting the inhibitor layer is defined as WI, a spacing between adjacent adsorption sites on the first surface is defined as DA,
   a width of a molecule X constituting a predetermined substance contained in the film-forming agent is defined as WP,
   wherein WP>DA−WI is satisfied when WI is smaller than DA, and
   wherein WP>DAx−WI is satisfied when WI is larger than DA, where x is a smallest integer that satisfies WI<DAx.

21. The method of claim 1, further comprising removing a native oxide film formed on a surface of the substrate before performing (A).

22. The method of claim 1, further comprising heat-treating the substrate after performing (B).

23. The method of claim 1, further comprising performing at least one selected from the group of desorbing at least a portion of the inhibitor layer and nullifying at least the portion of the inhibitor layer, after performing (B).

* * * * *